US012713901B2

United States Patent
(12)

Lee

(10) Patent No.: US 12,713,901 B2

(45) Date of Patent: Aug. 18, 2026

(54) SEMICONDUCTOR DEVICES AND DATA STORAGE SYSTEMS INCLUDING THE SAME

(71) Applicant: SAMSUNG ELECTRONICS CO., LTD., Suwon-si (KR)

(72) Inventor: Sooyong Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 689 days.

(21) Appl. No.: 18/133,314

(22) Filed: Apr. 11, 2023

(65) Prior Publication Data

US 2023/0395496 A1 Dec. 7, 2023

(30) Foreign Application Priority Data

Jun. 7, 2022 (KR) ........................ 10-2022-0068905

(51) Int. Cl.

*H01L 23/528* (2006.01)
*H01L 23/522* (2006.01)
(Continued)

(52) U.S. Cl.

CPC .......... *H10W 20/435* (2026.01); *H10B 41/10* (2023.02); *H10B 41/27* (2023.02); (Continued)

(58) Field of Classification Search

CPC ............. H01L 23/5283; H01L 23/5226; H01L 25/0652; H10B 41/10; H10B 41/27; (Continued)

(56) References Cited

U.S. PATENT DOCUMENTS 9,153,705 B2 10/2015 Zhang et al.
9,922,987 B1 3/2018 Mizutani et al.
(Continued)

FOREIGN PATENT DOCUMENTS

EP 3557622 A2 10/2019
KR 10-2022-0042566 A 4/2022
(Continued)

OTHER PUBLICATIONS

Communication issued on Nov. 20, 2023 by European Patent Office in European Application No. 23174958.1.

*Primary Examiner* — Steven B Gauthier
*Assistant Examiner* — Khatib A Rahman
(74) *Attorney, Agent, or Firm* — Sughrue Mion, PLLC

(57) ABSTRACT

A semiconductor device is provided. The semiconductor device includes: a first structure including a substrate, circuit elements on the substrate, and lower interconnections on the circuit elements; and a second structure on the first structure, the second structure including: a source structure having a first region and a second region; gate electrodes provided on the source structure and spaced apart from each other, extending in a first direction parallel to an upper surface of the substrate, and including pad regions forming a step structure on the second region; separation patterns passing through the gate electrodes and extending in the first direction; first vertical structures provided between the separation patterns on the first region and extending through the gate electrodes; and second vertical structures provided between the separation patterns, on the second region and extending through the pad regions of the gate electrodes, the second vertical structures and the first vertical structures having a common lattice arrangement.

19 Claims, 37 Drawing Sheets

(51) Int. Cl.

| | |
|---|---|
| ***H01L 25/065*** | (2023.01) |
| ***H10B 41/10*** | (2023.01) |
| ***H10B 41/27*** | (2023.01) |
| ***H10B 41/35*** | (2023.01) |
| ***H10B 41/40*** | (2023.01) |
| ***H10B 43/10*** | (2023.01) |
| ***H10B 43/27*** | (2023.01) |
| ***H10B 43/35*** | (2023.01) |
| ***H10B 43/40*** | (2023.01) |
| ***H10B 80/00*** | (2026.01) |
| ***H10W 20/41*** | (2026.01) |
| ***H10W 20/42*** | (2026.01) |
| ***H10W 90/00*** | (2026.01) |

(52) U.S. Cl.
CPC ............. *H10B 41/35* (2023.02); *H10B 41/40* (2023.02); *H10B 43/10* (2023.02); *H10B 43/27* (2023.02); *H10B 43/35* (2023.02); *H10B 43/40* (2023.02); *H10B 80/00* (2023.02); *H10W 20/42* (2026.01); *H10W 90/00* (2026.01)

(58) Field of Classification Search
CPC ........ H10B 41/35; H10B 41/40; H10B 43/10; H10B 43/27; H10B 43/35; H10B 43/40; H10B 80/00; H10B 43/50
See application file for complete search history.

(56) References Cited

U.S. PATENT DOCUMENTS

| | | | | |
|---|---|---|---|---|
| 10,861,863 | B2 * | 12/2020 | Kim | H10B 43/50 |
| 10,930,664 | B2 | 2/2021 | Son et al. | |
| 11,075,219 | B2 | 7/2021 | Zhang et al. | |
| 2016/0126252 | A1 | 5/2016 | Tsuda et al. | |
| 2021/0028186 | A1 | 1/2021 | Lim et al. | |
| 2021/0035910 | A1 * | 2/2021 | Kim | H10B 41/41 |
| 2021/0036014 | A1 * | 2/2021 | Yang | H10B 43/10 |
| 2021/0082941 | A1 * | 3/2021 | Son | H01L 23/528 |
| 2021/0134823 | A1 * | 5/2021 | Kang | H10B 43/40 |
| 2021/0151462 | A1 * | 5/2021 | Baek | H10B 41/50 |
| 2021/0159242 | A1 * | 5/2021 | Jang | H10B 41/35 |
| 2021/0296359 | A1 * | 9/2021 | Nam | H10B 41/40 |
| 2021/0399005 | A1 * | 12/2021 | Lee | H01L 21/76805 |
| 2021/0408025 | A1 | 12/2021 | Hinoue | |
| 2022/0051979 | A1 | 2/2022 | Kuroko et al. | |
| 2022/0102306 | A1 | 3/2022 | Ahn et al. | |
| 2024/0282392 | A1 * | 8/2024 | Hsu | G11C 11/5628 |

FOREIGN PATENT DOCUMENTS

| | | | |
|---|---|---|---|
| WO | 2016/148748 | A1 | 9/2016 |
| WO | 2019/042103 | A1 | 3/2019 |
| WO | 2020/077593 | A1 | 4/2020 |

* cited by examiner

100
VS1(CH)
VS2(SS)
SP
ST
CR
ER

SEMICONDUCTOR DEVICES AND DATA STORAGE SYSTEMS INCLUDING THE SAME

CROSS-REFERENCE TO RELATED APPLICATION

This application claims priority from Korean Patent Application No. 10-2022-0068905, filed on Jun. 7, 2022, in the Korean Intellectual Property Office, the disclosure of which is incorporated by reference herein in its entirety.

BACKGROUND

The present disclosure relates to a semiconductor device and a data storage system including the same.

Semiconductor devices capable of storing high-capacity data may be used in data storage systems. Accordingly, research into a method for increasing the data storage capacity of a semiconductor device is being carried out. For example, as a method for increasing the data storage capacity of a semiconductor device, a semiconductor device including three-dimensionally arranged memory cells instead of two-dimensionally arranged memory cells has been proposed.

SUMMARY

Example embodiments provide a semiconductor device having improved integration and mass-productivity.

Example embodiments provide a data storage system including a semiconductor device with improved integration and mass-productivity.

According to example embodiments, a semiconductor device includes: a first structure including a substrate, circuit elements on the substrate, and lower interconnections on the circuit elements; and a second structure on the first structure. The second structure includes: a source structure having a first region and a second region; gate electrodes provided on the source structure and spaced apart from each other, extending in a first direction parallel to an upper surface of the substrate, and including pad regions forming a step structure on the second region; separation patterns passing through the gate electrodes and extending in the first direction; first vertical structures provided between the separation patterns on the first region and extending through the gate electrodes; and second vertical structures provided between the separation patterns, on the second region and extending through the pad regions of the gate electrodes. The second vertical structures and the first vertical structures have a common lattice arrangement.

According to example embodiments, a semiconductor device includes: a source structure having a first region and a second region; gate electrodes stacked on the source structure and spaced apart from each other, extending in a first direction, and including pad regions forming a step structure on the second region; separation patterns passing through the gate electrodes and extending from the first region onto the second region in the first direction; channel structures provided between the separation patterns, and extending through the gate electrodes on the first region; support structures provided between the separation patterns, and extending through the pad regions of the gate electrodes on the second region; and a contact plug provided between the support structures on the second region, and including a cluster of contact structures electrically connected to each other. The cluster of contact structures has a continuous arrangement with the support structures.

According to example embodiments, a data storage system includes: semiconductor storage device including: a substrate; circuit elements on the substrate; a source structure provided on the substrate and having a first region and a second region; gate electrodes stacked on the source structure and spaced apart from each other, extending in a first direction and including pad regions forming a step structure, on the second region; separation patterns passing through the gate electrodes, extending in the first direction from the first region onto the second region, and having a wavy-shaped side surface; channel structures provided between the separation patterns and extending through the gate electrodes on the first region; support structures provided between the separation patterns and extending through the pad regions of the gate electrodes on the second region; and an input/output pad electrically connected to the circuit elements; and a controller electrically connected to the semiconductor storage device through the input/output pad and configured to control the semiconductor storage device. The support structures and the channel structures have a common lattice arrangement.

BRIEF DESCRIPTION OF DRAWINGS

The above and other aspects, features, and advantages of the present disclosure will be more apparent from the following description of example embodiments, taken in conjunction with the accompanying drawings, in which.

DETAILED DESCRIPTION

Figure 1A:
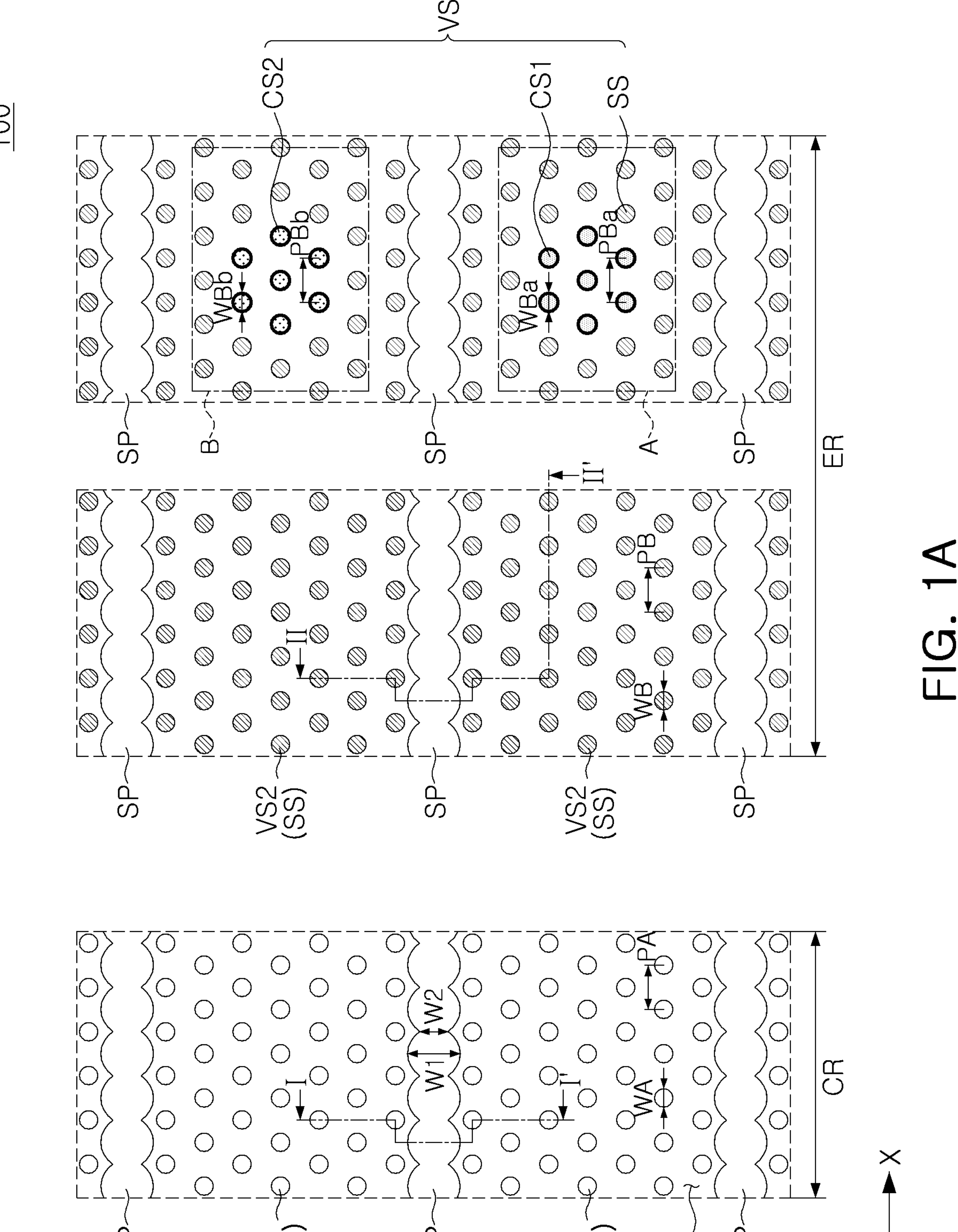
FIG. 1A is a schematic plan view of a semiconductor device according to example embodiments.

Hereinafter, example embodiments will be described with reference to the accompanying drawings. The same reference numerals may refer to the same elements throughout. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present.

FIG. 1A is a schematic plan view of a semiconductor device according to example embodiments.

Figure 1B:
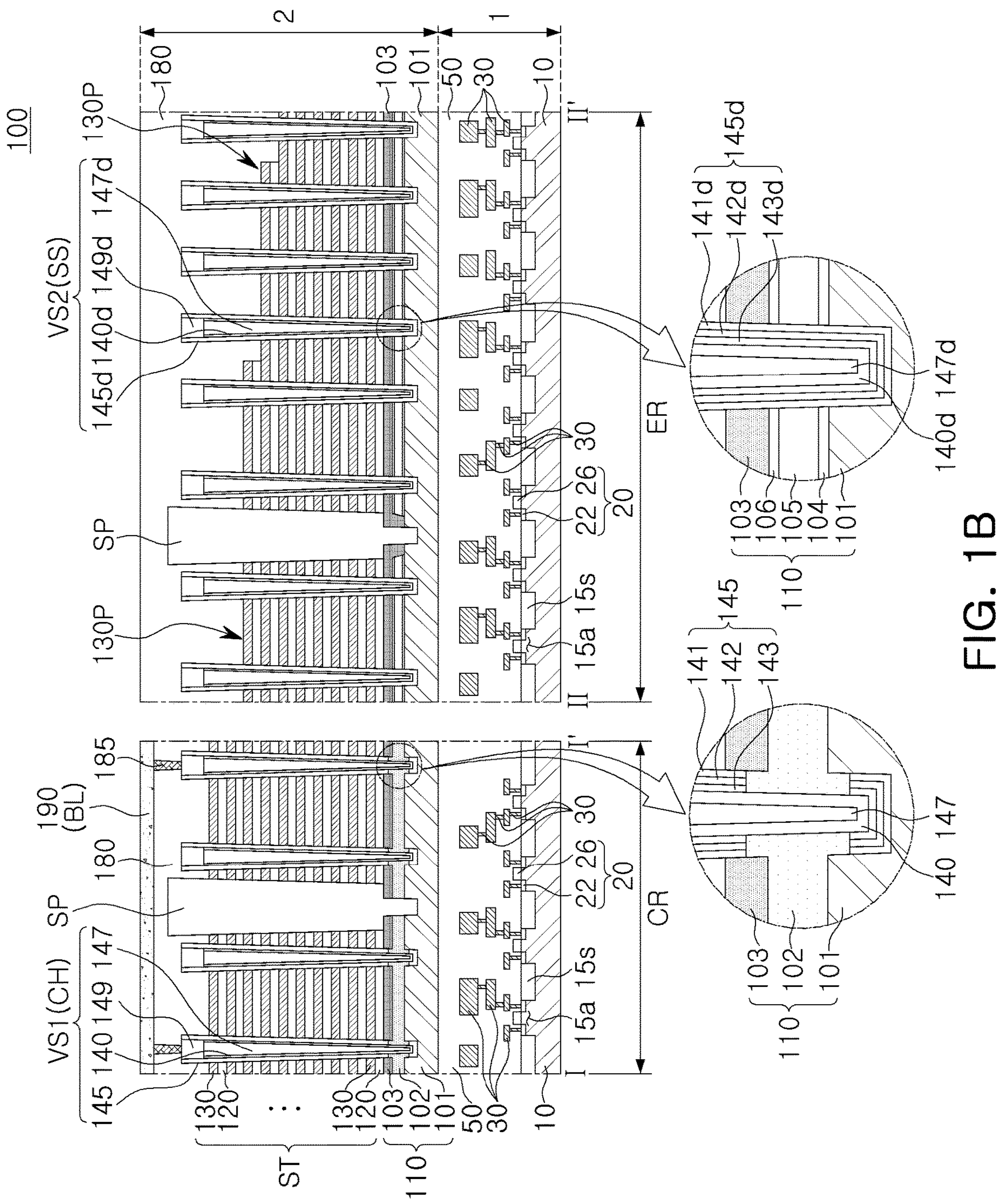
FIG. 1B is a schematic cross-sectional view of a semiconductor device according to example embodiments.

FIG. 1B is a schematic cross-sectional view of a semiconductor device according to example embodiments. FIG. 1B illustrates cross-sections taken along lines I-I' and II-II' of FIG. 1A.

Referring to FIGS. 1A and 1B, a semiconductor device 100 may include a first structure 1 including a substrate 10, and a second structure 2 including a source structure 110. The second structure 2 may be disposed on the first structure 1.

The first structure 1 may include the substrate 10, device isolation layers 15*s* defining an active region 15*a* within the substrate 10, circuit elements 20 disposed on the substrate 10, lower interconnections 30 electrically connected to the circuit elements 20, and a lower capping insulating layer 50 covering the circuit elements 20 and the lower interconnections 30.

The second structure 2 may include a source structure 110 having a first region CR and a second region ER, a stack structure ST including interlayer insulating layers 120 and gate electrodes 130, a separation patterns SP passing through the stack structure ST and extending in the X direction, first vertical structures VS1 passing through the stack structure ST, on the first region CR, second vertical structures VS2 passing through the stack structure ST, on the second region ER, an upper capping insulating layer 180 on the stack structure ST, and upper interconnections 190 on the first vertical structures VS1. By arranging the second vertical structures VS2 on the second region ER in the same or similar shape as the first vertical structures VS1 on the first region CR, the manufacturing process of semiconductor devices may be simplified, and process dispersion may be improved.

The substrate 10 may include a semiconductor material, for example, a group IV semiconductor, a group III-V compound semiconductor, or a group II-VI compound semiconductor. The substrate 10 may be provided as a bulk wafer or as an epitaxial layer. The device isolation layers 15*s* may be disposed in the substrate 10, and source/drain regions 22 including impurities may be disposed in a portion of the active region 15*a*.

The circuit elements 20 may each include a transistor including a source/drain region 22 and a circuit gate 26. The source/drain regions 22 may be disposed on both sides of the circuit gate 26 in the active region 15*a*. The circuit gate 26 may include a dielectric layer on active region 15*a* and a circuit gate electrode on the dielectric layer.

The lower interconnections 30 may be electrically connected to the circuit elements 20. The lower interconnections 30 may be disposed at different levels and may include a plurality of interconnection layers connected to each other by vias. The lower interconnections 30 may include a conductive material, for example, a metallic material such as tungsten (W), titanium (Ti), copper (Cu), aluminum (Al), molybdenum (Mo), ruthenium (Ru), or the like.

The lower capping insulating layer 50 may cover the substrate 10, the circuit elements 20, and the lower interconnections 30. The lower capping insulating layer 50 may be formed of an insulating material such as silicon oxide, silicon nitride, silicon oxynitride, silicon carbonate, or the like. The lower capping insulating layer 50 may include a plurality of insulating layers.

The source structure 110 may be disposed on the first structure 1. At least a portion of the source structure 110 may be formed of, for example, polycrystalline silicon having an N-type conductivity. In the source structure 110, a region formed of polycrystalline silicon having an N-type conductivity may be a common source region. According to example embodiments, the source structure 110 may include at least one of doped polycrystalline silicon, a metal, a metal nitride, and a metal-semiconductor compound.

In an example embodiment, the source structure 110 may include a base pattern 101, a first pattern 102, a second pattern 103, and source sacrificial layers 104, 105, and 106. The first pattern 102 may be disposed on the base pattern 101, and the second pattern 103 may be disposed on the first pattern 102. At least one of the base pattern 101, the first pattern 102, and the second pattern 103 may include silicon. The first pattern 102 penetrates the gate dielectric layer 145 in the first region CR, and may be directly connected to the channel layer 140 on the periphery of the channel layer 140. The source sacrificial layers 104, 105, and 106 may be disposed in the second region ER and may be disposed at the same level as the first pattern 102. The source sacrificial layers 104, 105, and 106 may include an insulating material such as silicon oxide or silicon nitride.

The gate electrodes 130 and the channel structures CH may be disposed on the first region CR of the source structure 110 to provide memory cells. The gate electrodes 130 provide pad regions 130P having a stepped structure, may be disposed on the second region ER of the source structure 110, such that gate contact plugs ('CMC' in FIG.

6A) and/or through-contact plugs ('THV' in FIG. 8A) may be provided. The first region CR may be referred to as a 'memory cell array region,' and the second region ER may be referred to as a 'step region' or a 'connection area.'

The gate electrodes 130 may be stacked and spaced apart from each other in the Z direction on the source structure 110 to form the stack structure ST. The gate electrodes 130 may extend in the X direction. The gate electrodes 130 may include lower gate electrodes forming the gates of the ground select transistors, memory gate electrodes forming the plurality of memory cells, and upper gate electrodes forming the gates of the string select transistors. The number of the memory gate electrodes constituting the memory cells may be determined according to the capacity of the semiconductor device 100. In example embodiments, the gate electrodes 130 may further include a gate electrode disposed above the upper gate electrodes and/or below the lower gate electrodes to form an erase transistor used for an erase operation using a gate induced drain leakage (GIDL) phenomenon.

The gate electrodes 130 may extend along the X direction from the first region CR to the second region ER to form a stepped structure in the form of a step. Due to the step structure, the lower gate electrode 130 may extend further than the upper gate electrode 130 of the gate electrodes 130, and may have pad regions 130P exposed upwards. The pad regions 130P may be regions including ends of the gate electrodes 130 along the X direction. The gate electrodes 130 may be electrically connected to the gate contact plugs CMC in the pad regions 130P, respectively (refer to FIG. 6B).

The gate electrodes 130 may be disposed to be separated from each other in the Y direction by the separation patterns SP extending in the X direction. The gate electrodes 130 between the pair of separation patterns SP may form one memory block, but the scope of the memory block is not limited thereto. Some of the upper gate electrodes 130 among the gate electrodes 130 may be separated from each other in the Y direction by a string separation pattern, and may provide gates of the string select transistors. In another example, the gates of the string select transistors may be provided as string select gate electrodes extending in the X direction on the stack structure ST. In this case, string select channel structures passing through the string select gate electrodes and connected to upper ends of the channel structures CH may be further disposed on the stack structure ST.

Each of the gate electrodes 130 may include a first layer and a second layer, the first layer may cover the upper and lower surfaces of the second layer, and may extend between the channel structures CH and the second layer. The first layer may include a high dielectric material such as aluminum oxide (AlO), and the second layer may include at least one of titanium (Ti), titanium nitride (TiN), tantalum (Ta), tantalum nitride (TaN), tungsten (W), and tungsten nitride (WN). According to an example embodiment, the gate electrodes 130 may include polycrystalline silicon or a metal-semiconductor compound.

The interlayer insulating layers 120 may be disposed between the gate electrodes 130, and may form a stack structure ST. Like the gate electrodes 130, the interlayer insulating layers 120 may be spaced apart from each other in the Z direction and may be disposed to extend in the X direction. The interlayer insulating layers 120 may include an insulating material such as silicon oxide or silicon nitride. In the stack structure ST the interlayer insulating layer 120 and the gate electrodes 130 may be alternately and repeatedly provided.

The stack structure ST may include a lower stack structure and an upper stack structure on the lower stack structure. The gate electrodes 130 of the lower stack structure may form a first gate stacked group, and the gate electrodes 130 of the upper stack structure may form a second gate stacked group. Between the lower stack structure and the upper stack structure, the first vertical structures VS1 and the second vertical structures VS2 may have a shape in which side surfaces are bent.

The separation patterns SP may be disposed to extend in the X direction from the first region CR to the second region ER. The separation patterns SP may penetrate through the entire gate electrodes 130 of the stack structure ST and contact the source structure 110. The separation patterns SP may be formed by expanding and merging a plurality of hole patterns, and in a plan view, the side surfaces thereof may have an uneven shape, for example a wavy shape or an embossed shape. The separation patterns SP may have a shape in which first portions having a first width W1 in the Y direction and second portions having a second width W2 smaller than the first width W1 in the Y direction are alternately and repeatedly arranged along the X direction.

The separation patterns SP may be spaced apart from a portion of the first vertical structures VS1 and a portion of the second vertical structures VS2 closest to the separation patterns SP, but in some example embodiments, a portion of the first vertical structures VS1 closest to the separation patterns SP and a portion of the second vertical structures VS2 may be in contact with the separation patterns SP. The separation patterns SP may have curved sides in cross-section, but the structure seen in the cross-section of the separation patterns SP may be variously changed according to example embodiments. The separation patterns SP may be formed of an insulating material, for example, silicon oxide.

As illustrated in FIG. 1A, the first vertical structures VS1(CH) may respectively form one memory cell string, and may be disposed to be spaced apart from each other while forming rows and columns on the first region CR. The first vertical structures VS1(CH) may be disposed between the separation patterns SP. The first vertical structures VS1 (CH) may have a lattice arrangement (e.g., a triangular lattice, a hexagonal lattice, or a rhombus lattice). The first vertical structures VS1(CH) may have a columnar shape, and may have inclined sides that become narrower as they get closer to the source structure 110 according to an aspect ratio. The first vertical structures VS1(CH) may include channel structures CH.

As illustrated in the enlarged view of FIG. 1B, the channel structures CH may include a channel layer 140, a gate dielectric layer 145, a core insulating layer 147, and a channel pad 149. The channel layer 140 may be disposed in an annular shape surrounding the core insulating layer 147, and the gate dielectric layer 145 may be disposed in an annular shape surrounding the channel layer 140. The gate dielectric layer 145 may extend to a lower end of the channel structure CH. The channel layer 140 may be disposed on the gate dielectric layer 145. A lower portion of the channel layer 140 may be connected to the first pattern 102. The channel layer 140 may include a semiconductor material such as polycrystalline silicon or single crystal silicon, and may include a region doped with an impurity. The core insulating layer 147 may include silicon oxide or silicon oxide having voids formed therein. The channel pad 149 may be disposed on the core insulating layer 147 and may be connected to an upper portion of the channel layer 140. The channel pad 149 may include, for example, doped polycrystalline silicon.

The gate dielectric layer 145 may be disposed between the gate electrodes 130 and the channel layer 140. The gate dielectric layer 145 may contact the gate electrodes 130. The gate dielectric layer 145 may include a tunneling layer 143, an information storage layer 142, and a blocking layer 141 sequentially stacked from the channel layer 140. The tunneling layer 143 may tunnel charges to the information storage layer 142, and may include, for example, silicon oxide or silicon oxide doped with impurities. The information storage layer 142 may include a material capable of storing information by trapping electric charges, for example, silicon nitride. The information storage layer 142 may include regions capable of storing information in a semiconductor device such as a flash memory device. The blocking layer 141 may include silicon oxide, silicon nitride, silicon oxynitride, a high-k dielectric material, or combinations thereof.

As illustrated in FIG. 1A, the second vertical structures VS2 may be disposed to be spaced apart from each other while forming rows and columns on the second region ER. The second vertical structures VS2 may be disposed between the separation patterns SP and may penetrate through the pad regions 130P of the gate electrodes 130. The second vertical structures VS2 may have the same lattice form (e.g., triangular lattice, hexagonal lattice, or rhombic lattice) as that of the first vertical structures VS1(CH). The second vertical structures VS2 may have a continuous arrangement on the second region ER. By making the design of the patterns disposed on the second region ER the same as or a similar to the design of the patterns disposed on the first region CR, continuous and uniform patterning is possible, such that a margin of a photolithography process and an etching process may be significantly increased, and process dispersion of semiconductor device manufacturing may be improved. In addition, because patterning may be performed with a certain design, it is possible to reduce the difficulty of a high aspect ratio etching process during a semiconductor device manufacturing process.

The first vertical structures VS1(CH) may be arranged at a first pitch PA in the X-direction and may have a first diameter WA, and the second vertical structures VS2(SS) may be arranged at a second pitch PB in the X-direction and may have a second diameter WB. The second pitch PB may be about 0.5 to about 1.5 times the first pitch PA. For example, the second pitch PB may be substantially the same as the first pitch PA. The second diameter WB may be about 0.5 times to about 1.5 times the first diameter WA. For example, the second diameter WB may be substantially the same as the first diameter WA. In the present specification, "pitch" may mean the minimum length from the center to the center for one configuration, and "diameter", which is relatively described in comparison, means a diameter at the same height. or the maximum diameter.

The second vertical structures VS2 may include support structures SS and contact structures CS1 and CS2. The contact structures CS1 and CS2 will be further described with reference to FIGS. 6A, 6B, 8A and 8B, and the support structures SS will be further described below.

The support structures SS may be formed in the same process step as the channel structures CH and may have the same or similar internal structure as the channel structures CH. For example, each of the support structures SS may include a support channel layer 140*d*, a support dielectric layer 145*d*, a support core insulating layer 147*d*, and a support channel pad 149*d*. The support channel layer 140*d* may be spaced apart from the source structure 110. The support dielectric layer 145*d* may extend to a lower end of the support structure SS. As illustrated in the enlarged view of FIG. 1B, the support dielectric layer 145*d* may include a support tunneling layer 143*d*, a support information storage layer 142*d*, and a support blocking layer 141*d* sequentially stacked from the support channel layer 140*d*.

The support structures SS may be dummy structures that do not perform a substantial function during the operation of the semiconductor device 100, and may serve to improve structural stability of the stack structure ST. In other examples, the support structures SS may have a structure in which the inside is filled with silicon oxide, unlike the channel structures CH. The number of gate electrodes 130 through which any one of the support structures SS passes may be less than the number of gate electrodes 130 through which any one of the channel structures CH passes.

The upper capping insulating layer 180 may cover the stack structure ST, the separation patterns SP, and the first and second vertical structures VS1 and VS2. The upper capping insulating layer 180 may include an insulating material such as silicon oxide, silicon nitride, or silicon oxycarbide. The upper capping insulating layer 180 may include a plurality of insulating layers.

The upper interconnections 190 may include bit lines BL disposed on the stack structure ST. The bit lines BL may be electrically connected to the channel pads 149 of the channel structures CH through connection plugs 185, respectively. The upper interconnections 190 may further include interconnections electrically connected to the gate contact plug CMC or the through contact plug THY. The upper interconnections 190 may include a metal material, for example, at least one of tungsten (W), titanium (Ti), copper (Cu), and aluminum (Al).

Figure 2A:
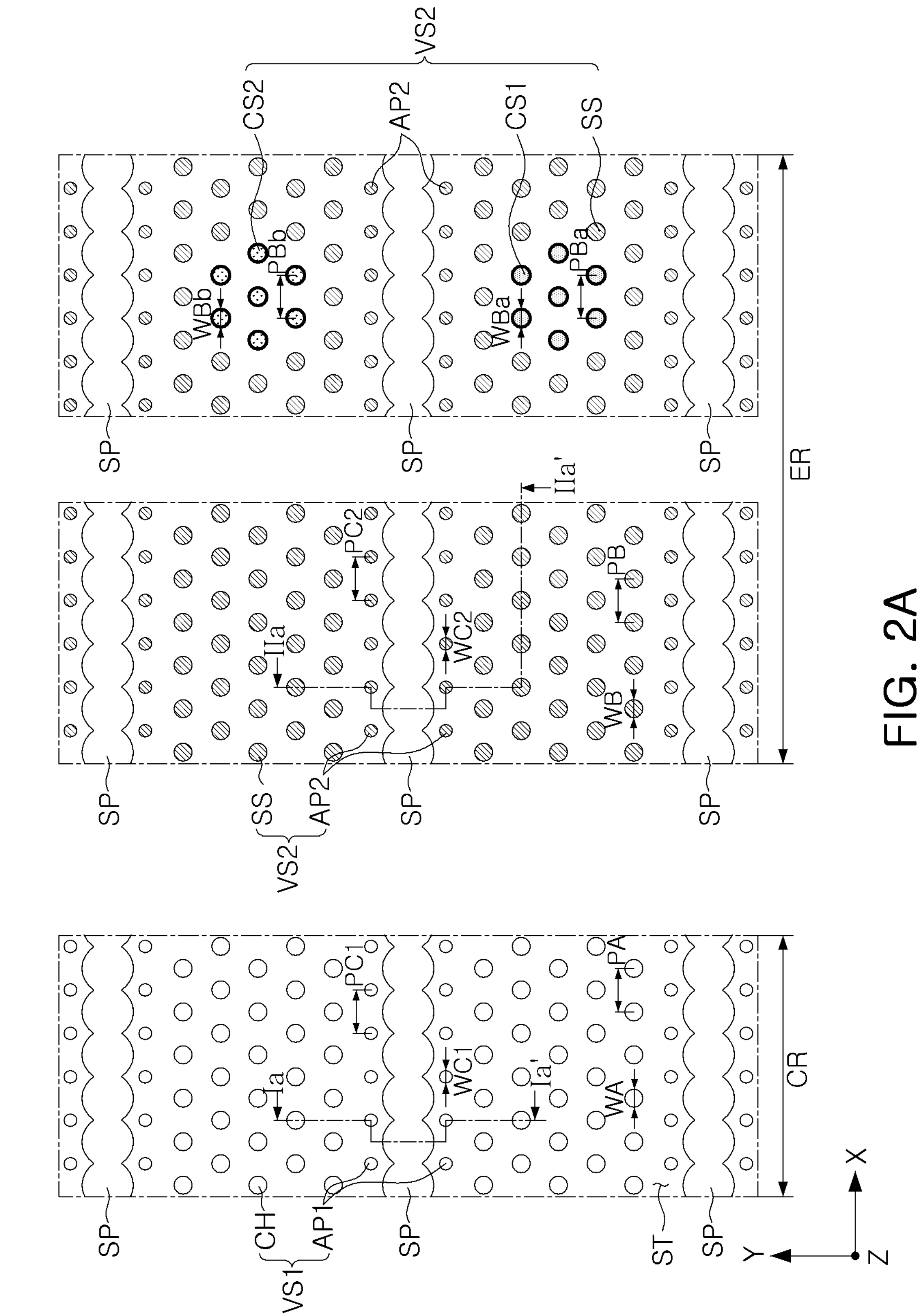
FIG. 2A is a schematic plan view of a semiconductor device according to example embodiments.

FIG. 2A is a schematic plan view of a semiconductor device according to example embodiments.

Figure 2B:
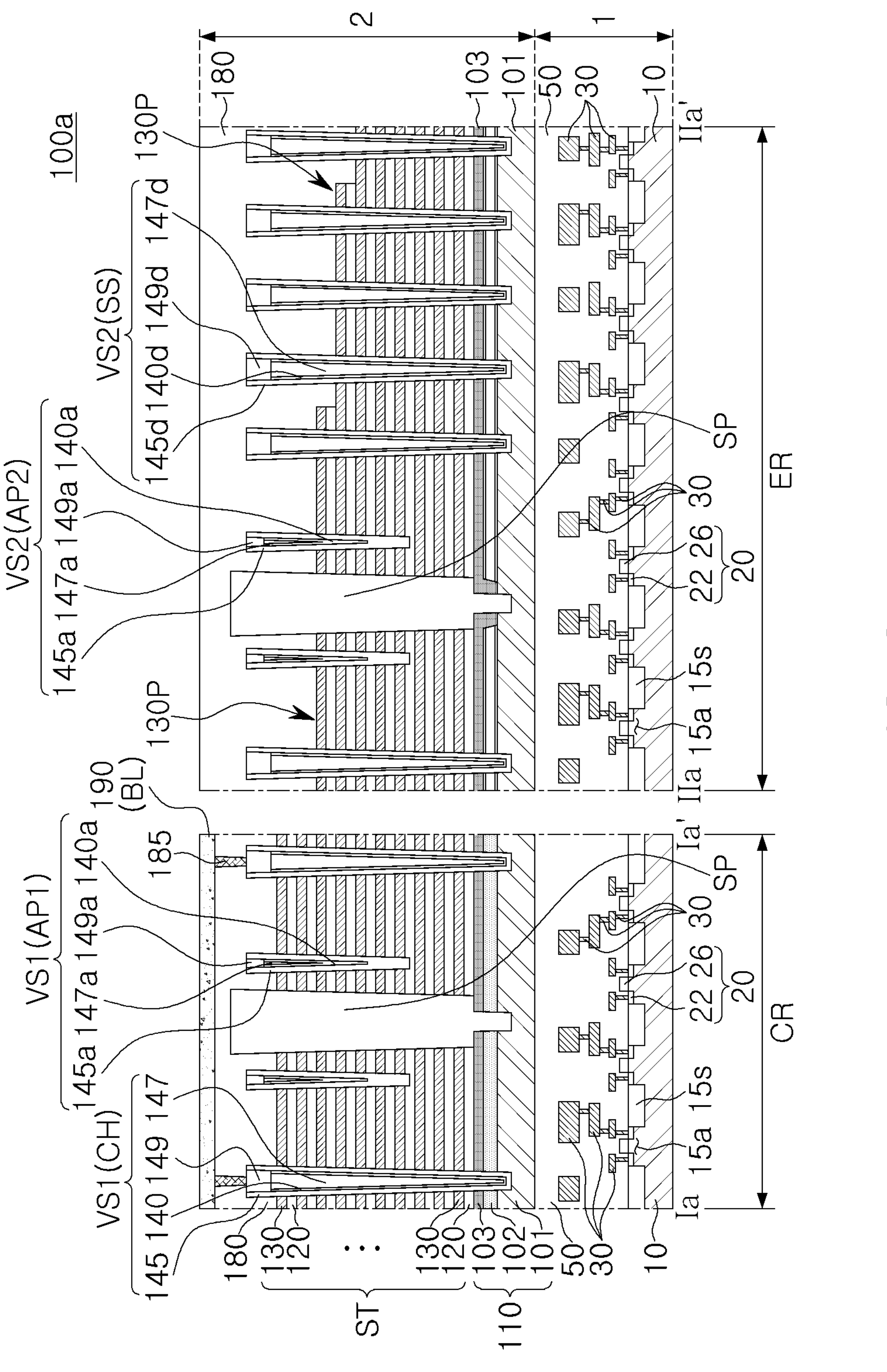
FIG. 2B is a schematic cross-sectional view of a semiconductor device according to example embodiments.

FIG. 2B is a schematic cross-sectional view of a semiconductor device according to example embodiments. FIG. 2B illustrates cross-sections along the cut lines Ia-Ia' and IIa-IIa' of FIG. 2A.

Figure 2C:
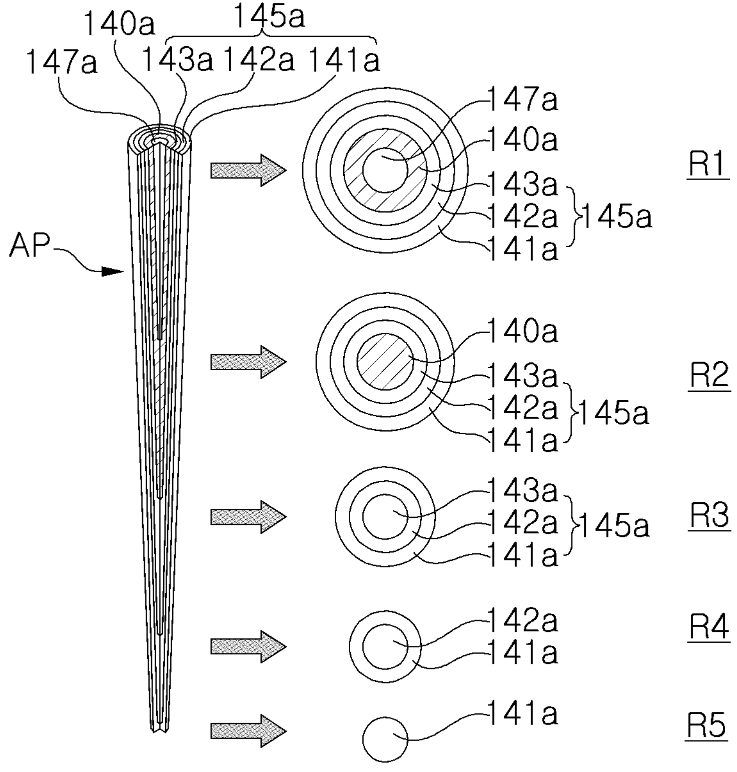
FIG. 2C is a schematic cut-away perspective view of an auxiliary pattern of a semiconductor device according to example embodiments.

FIG. 2C is a schematic cut-away perspective view of an auxiliary pattern of a semiconductor device according to example embodiments. In FIG. 2C, only the area below the auxiliary channel pad 149*a* in the auxiliary pattern AP is illustrated.

Referring to FIGS. 2A and 2B, the first structures VS1 of the semiconductor device 100*a* may include channel structures CH and first auxiliary patterns AP1, and the second structures VS2 may include support structures SS and second auxiliary patterns AP2. The first auxiliary patterns AP1 may be disposed between the separation patterns SP and the channel structures CH, on the first region CR, and may be arranged in a line on at least one side of the separation patterns SP. The second auxiliary patterns AP2 may be disposed between the separation patterns SP and the support structures SS on the second region ER, and may be arranged in a line on at least one side of the separation patterns SP.

The channel structure CH may have a first diameter WA, and the first auxiliary pattern AP1 may have a first diameter WC1 smaller than the first diameter WA. The support structure SS may have a second diameter WB, and the second auxiliary pattern AP2 may have a second diameter WC2 smaller than the second diameter WB. The first pitch PC1 of the first auxiliary patterns AP1 may be substantially the same as the first pitch PA of the channel structures CH, and the second pitch PC2 of the second auxiliary patterns AP2 may be substantially the same as the second pitch PB of the support structures SS. The first diameter WC1 of the first auxiliary pattern AP1 may be substantially the same as or different from the second diameter WC2 of the second auxiliary pattern AP2. The first pitch PC1 of the first auxiliary patterns AP1 may be substantially the same as or different from the second pitch PC2 of the second auxiliary patterns AP2.

Lower ends of the first auxiliary patterns AP1 may be located at a higher level than lower ends of the channel structures CH, and lower ends of the second auxiliary patterns AP2 may be located at a higher level than lower ends of the support structures SS. Lower ends of the auxiliary patterns AP including the first and second auxiliary patterns AP1 and AP2 may be disposed inside the stack structure ST. The auxiliary patterns AP may partially penetrate through the gate electrodes 130 from the top and may not penetrate some of the lower gate electrodes 130. The Z-direction heights of the first auxiliary patterns AP1 may be smaller than the Z-direction heights of the channel structures CH, and the Z-direction heights of the second auxiliary patterns AP2 may be smaller than the Z-direction heights of the support structures SS. The auxiliary patterns AP may be positioned to be spaced apart from the source structure 110 in the Z direction.

As illustrated in FIG. 2C, each of the auxiliary patterns AP may include an auxiliary dielectric layer 145*a*, an auxiliary channel layer 140*a*, and an auxiliary core insulating layer 147*a*. Because the auxiliary pattern AP has a diameter and a height less than those of the channel structure CH and the support structure SS, at least a portion of the auxiliary dielectric layer 145*a*, the auxiliary channel layer 140*a*, and the auxiliary core insulating layer 147*a* may not extend from the upper end to the lower end of the auxiliary pattern AP. For example, the auxiliary dielectric layer 145*a* may extend to the lower end of the auxiliary pattern AP, but the auxiliary channel layer 140*a* may extend to a shorter length than the auxiliary dielectric layer 145*a*.

In the first region R1 adjacent to the auxiliary channel pad 149*a*, the auxiliary dielectric layer 145*a*, the auxiliary channel layer 140*a*, and the auxiliary core insulating layer 147*a* may be sequentially disposed in the hole of the auxiliary pattern AP from the outside.

The auxiliary dielectric layer 145*a* and the auxiliary channel layer 140*a* may be sequentially disposed in the hole of the auxiliary pattern AP, in the second region R2 below the first region R1, from the outside. The auxiliary core insulating layer 147*a* may not extend in the second region R2.

In the third region R3 below the second region R2, the first to third auxiliary dielectric layers 141*a*, 142*a*, and 143*a* constituting the auxiliary dielectric layer 145*a* may be disposed sequentially in the hole of the auxiliary pattern AP from the outside. The auxiliary channel layer 140*a* and the auxiliary core insulating layer 147*a* may not extend in the third region R3. For example, the distance between the lower end of the auxiliary channel layer 140*a* and the lower end of the auxiliary pattern AP may be greater than the distance between the lower end of the channel layer 140 and the lower end of the channel structure CH, and may be greater than the distance between the lower end of the support channel layer 140*d* and the lower end of the support structure SS.

In the fourth region R4 below the third region R3, the first and second auxiliary dielectric layers 141*a* and 142*a* forming the auxiliary dielectric layer 145*a* may be sequentially disposed from the outside in the hole of the auxiliary pattern AP. The third auxiliary dielectric layer 143*a*, the auxiliary channel layer 140*a*, and the auxiliary core insulating layer 147*a* may not extend in the fourth region R4.

In the fifth region R5 including the lower end of the auxiliary pattern AP, the channel hole of the auxiliary pattern AP may be filled with the first dielectric layer 141*a* constituting the auxiliary dielectric layer 145*a*. The second and third auxiliary dielectric layers 142*a* and 143*a*, the auxiliary channel layer 140*a*, and the auxiliary core insulating layer 147*a* may not extend in the fifth region R5.

However, in another example, the auxiliary pattern AP may include only a partial region of the second to fifth regions R2, R3, R4, and R5. For example, the auxiliary pattern AP may include only the first region R1 and the fifth region R5. The internal structure of the auxiliary pattern AP may be variously changed according to the diameter, height, side inclination of the auxiliary pattern AP, the thickness of each layer constituting the auxiliary pattern AP, or the like.

In another example, when the stack structure ST is includes a lower stack structure and an upper stack structure on the lower stack structure, the auxiliary pattern may include a lower auxiliary pattern partially penetrating through the lower stack structure from an upper portion, and an upper auxiliary pattern penetrating through the upper stack structure and connected to the lower auxiliary pattern. The lower auxiliary pattern may have a width smaller than a width of other vertical structures passing through the lower stack structure, and a lower end of the lower auxiliary pattern may be located at a higher level than lower ends of other vertical structures passing through the lower stack structure.

Figure 3A:
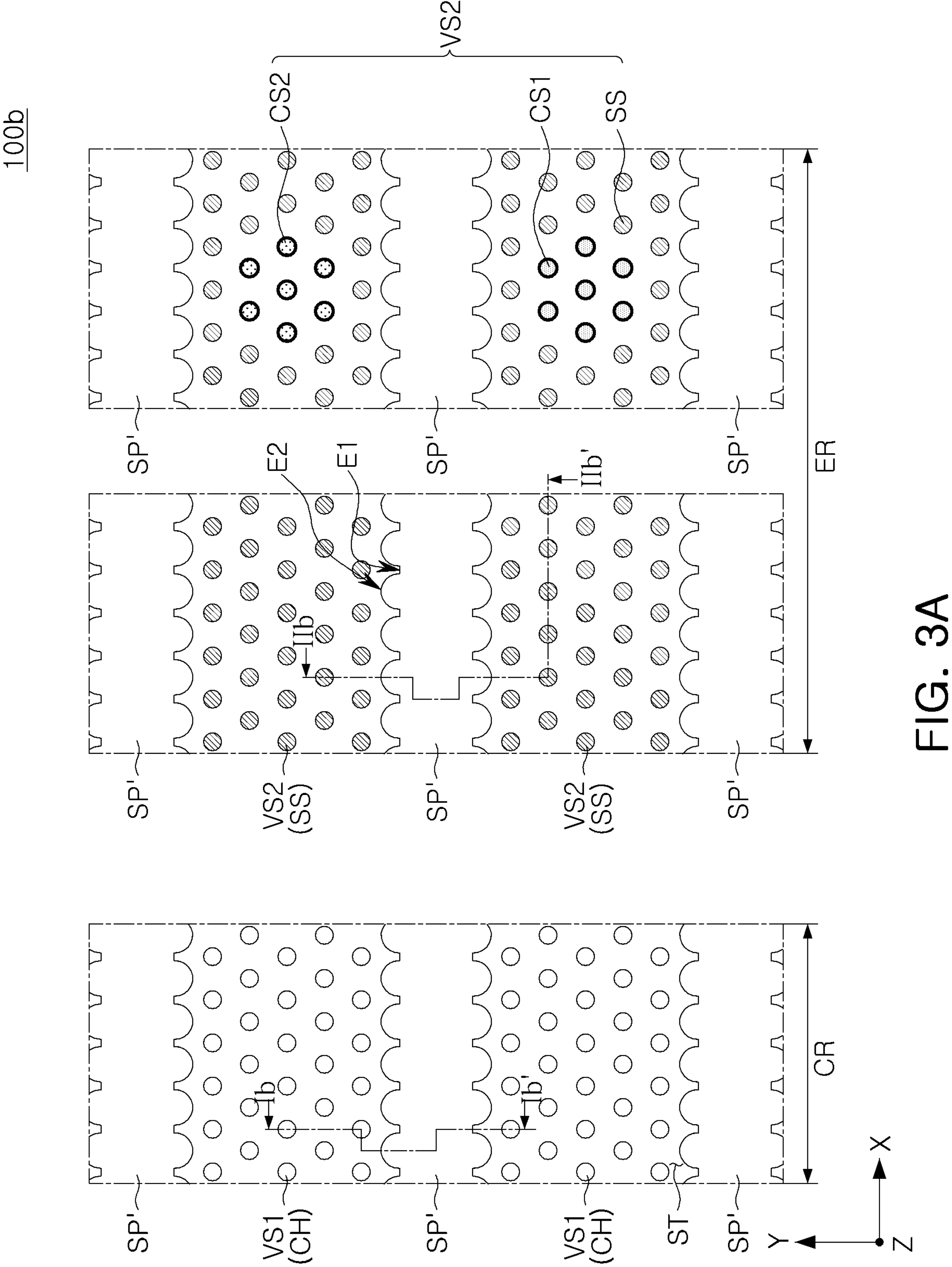
FIG. 3A is a schematic plan view of a semiconductor device according to example embodiments.

FIG. 3A is a schematic plan view of a semiconductor device according to example embodiments.

Figure 3B:
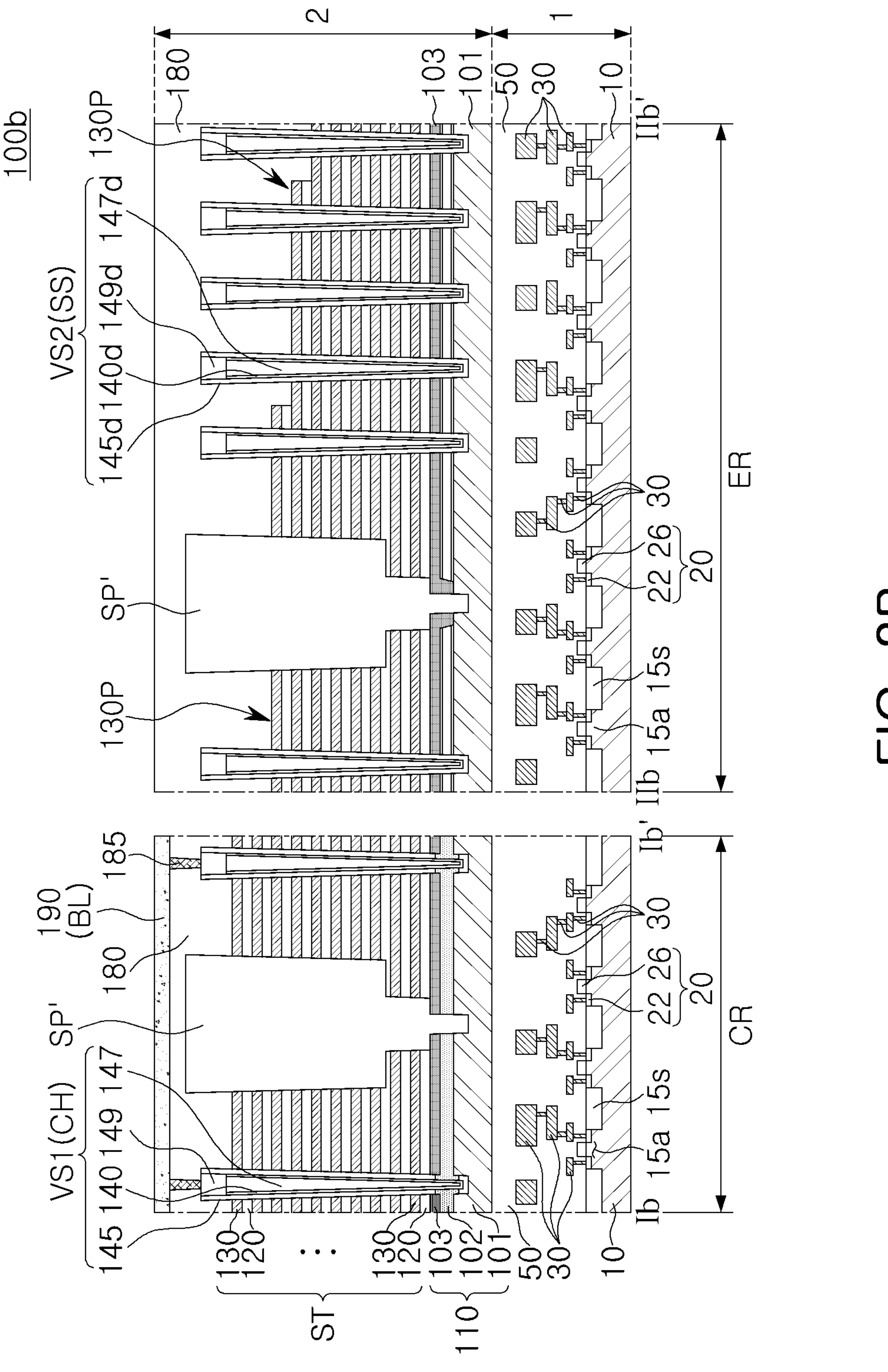
FIG. 3B is a schematic cross-sectional view of a semiconductor device according to example embodiments.

FIG. 3B is a schematic cross-sectional view of a semiconductor device according to example embodiments. FIG. 3B illustrates cross-sections taken along lines Ib-Ib' and IIb-IIb' of FIG. 3A.

Referring to FIGS. 3A and 3B, separation patterns SP' of a semiconductor device 100*b* may be formed by merging holes of the auxiliary patterns AP and adjacent separation patterns SP as illustrated in FIG. 2A. For example, the holes of the auxiliary patterns AP and the separation patterns SP may be expanded and merged with each other. In this case, the side surfaces of the separation patterns SP' may have a double embossed shape in a plane. Two or more types of embossing patterns may be present on the side surfaces of the separation patterns SP', and for example, the side surfaces of the separation patterns SP' may have a first embossing pattern E1 having a first curvature and a second embossing pattern E2 having a second curvature greater than the first curvature.

At a level lower than the lower ends of the auxiliary patterns AP, the lower regions of the separation patterns SP' do not merge with the holes of the auxiliary patterns AP, and thus, the side surfaces thereof may have a single embossed shape in a plane. For example, an upper region of the side surfaces of the separation patterns SP' may have a double embossed shape in a plane, and a lower region of a side surface of the separation patterns SP' may have a single embossed shape in a plane view.

Figure 4A:
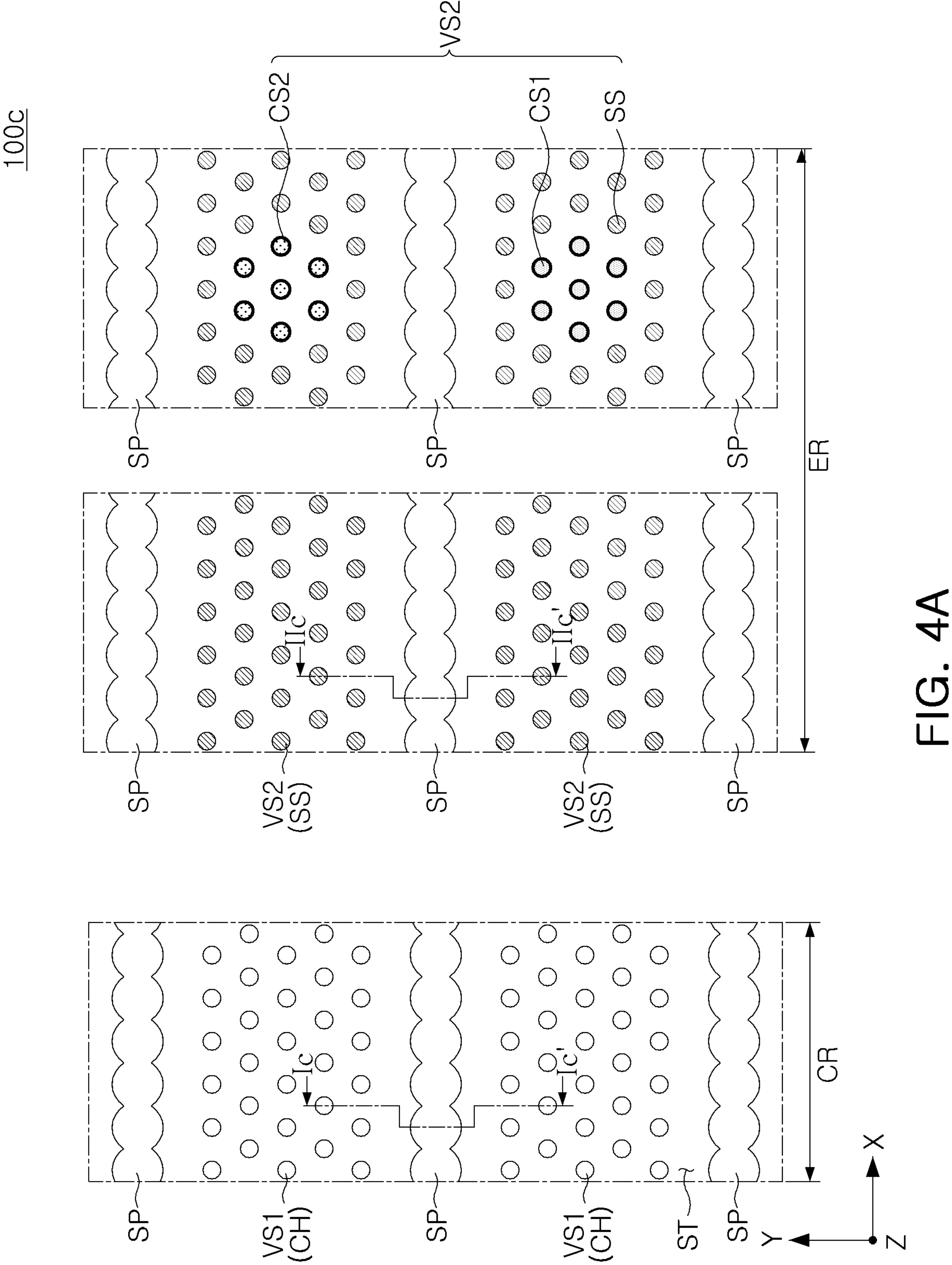
FIG. 4A is a schematic plan view of a semiconductor device according to example embodiments.

FIG. 4A is a schematic plan view of a semiconductor device according to example embodiments.

Figure 4B:
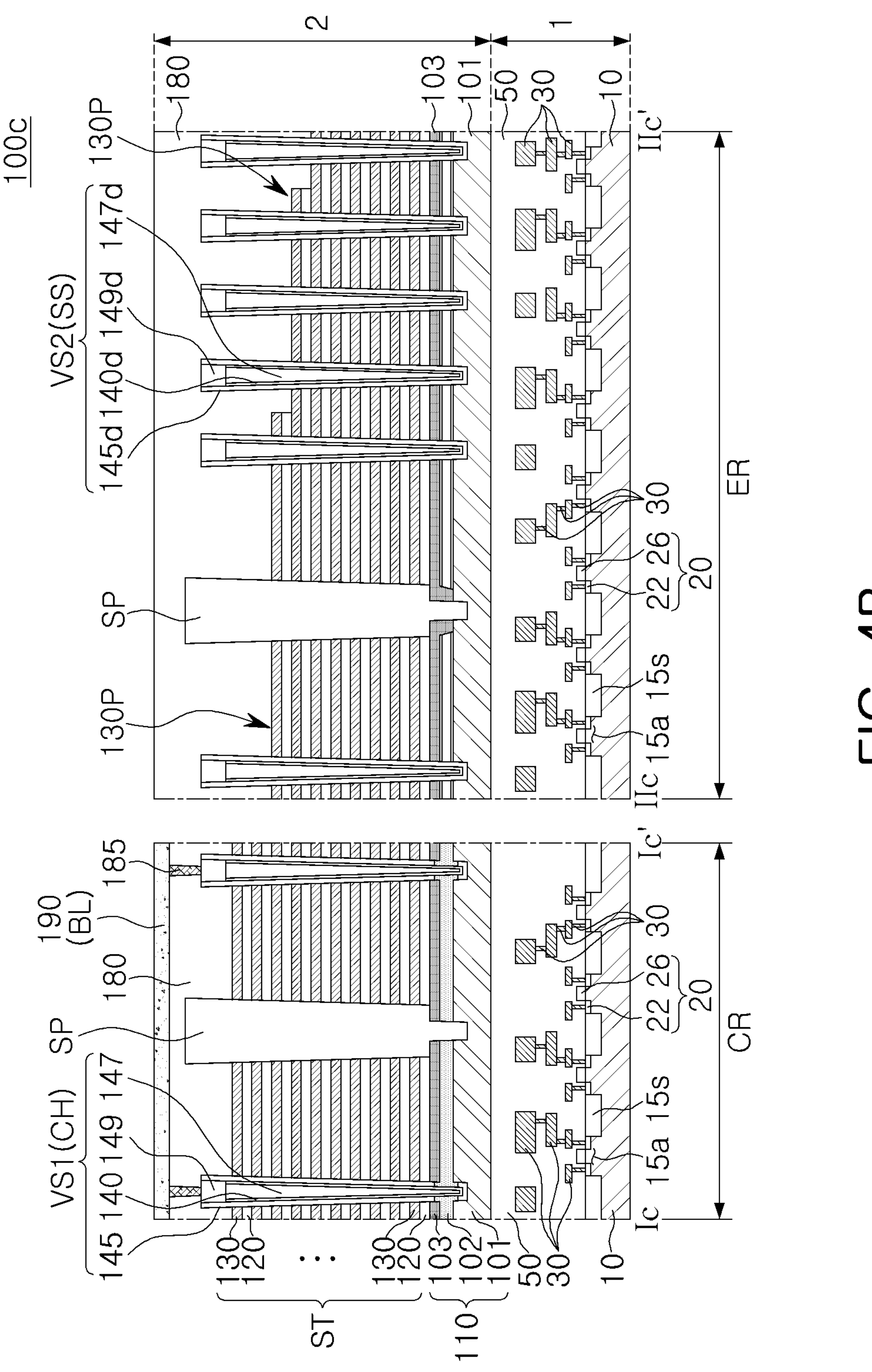
FIG. 4B is a schematic cross-sectional view of a semiconductor device according to example embodiments.

FIG. 4B is a schematic cross-sectional view of a semiconductor device according to example embodiments. FIG. 4B illustrates cross-sections taken along lines Ic-Ic' and IIc-IIc' of FIG. 4A.

Referring to FIGS. 4A and 4B, in a semiconductor device 100*c*, patterning may not be performed in the region corresponding to the auxiliary patterns AP illustrated in FIGS. 2A and 2B. Accordingly, the semiconductor device 100*c* may not include the auxiliary patterns AP. For example, compared to the semiconductor device 100 of FIGS. 1A and 1B, the semiconductor device 100*c* may have a structure in which a portion of the first vertical structures VS1 disposed in a column closest to the separation patterns SP among the first vertical structures VS1 arranged in the X direction is omitted and a portion of the second vertical structures VS2 disposed in a column closest to the separation patterns SP among the second vertical structures VS2 arranged in the X direction is omitted. The example embodiment of FIGS. 4A and 4B may correspond to the case in which the mask on the regions corresponding to the auxiliary patterns AP is not completely opened (see FIGS. 14A and 14B), and thus, no patterning trace remains in the stack structure ST.

Figure 5:
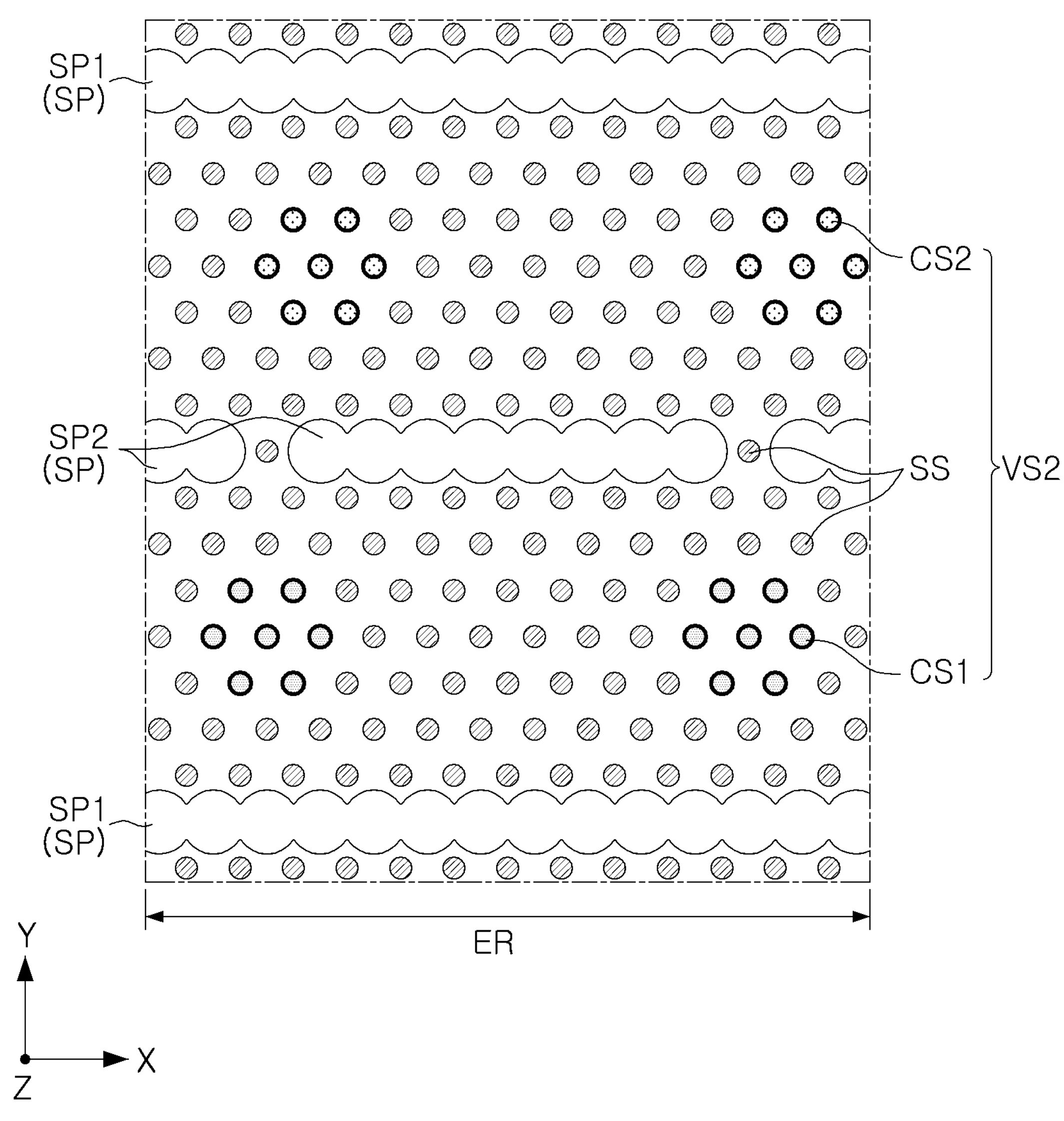
FIG. 5 is a schematic plan view of a semiconductor device according to example embodiments.

FIG. 5 is a schematic plan view of a semiconductor device according to example embodiments.

Referring to FIG. 5, the separation patterns SP of a semiconductor device 100*d* may include first separation patterns SP1 continuously extending in the X direction and second separation patterns SP2 intermittently extending in the X direction. The second separation patterns SP2 may intermittently extend on the second region ER, and at least one support structure SS may be disposed between the second separation patterns SP2 (e.g., along the X direction). According to an example embodiment, at least one auxiliary pattern AP may be disposed between the second separation patterns SP2 (e.g., along the X direction).

Figure 6A:
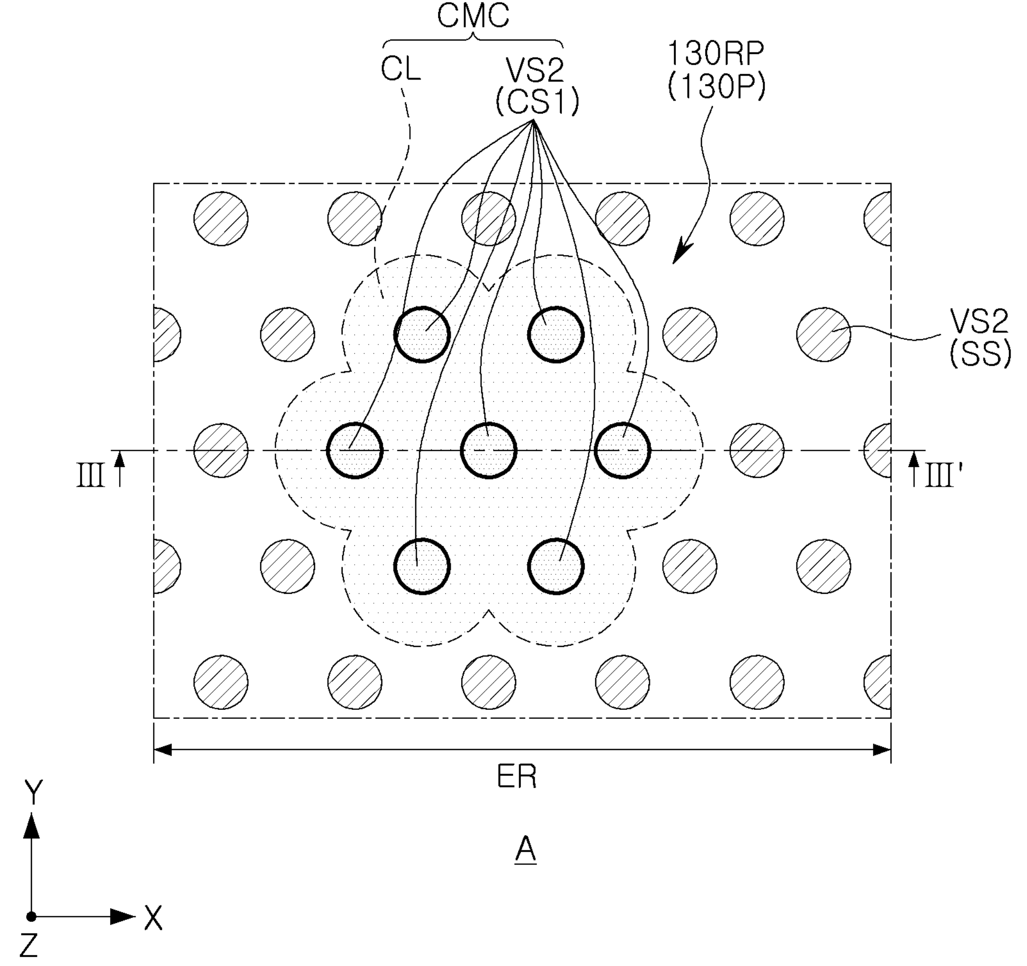
FIG. 6A is a schematic partially enlarged plan view of a semiconductor device according to example embodiments.

FIG. 6A is a schematic partially enlarged plan view of a semiconductor device according to example embodiments. FIG. 6A illustrates an enlarged view of area 'A' of FIG. 1A.

Figure 6B:
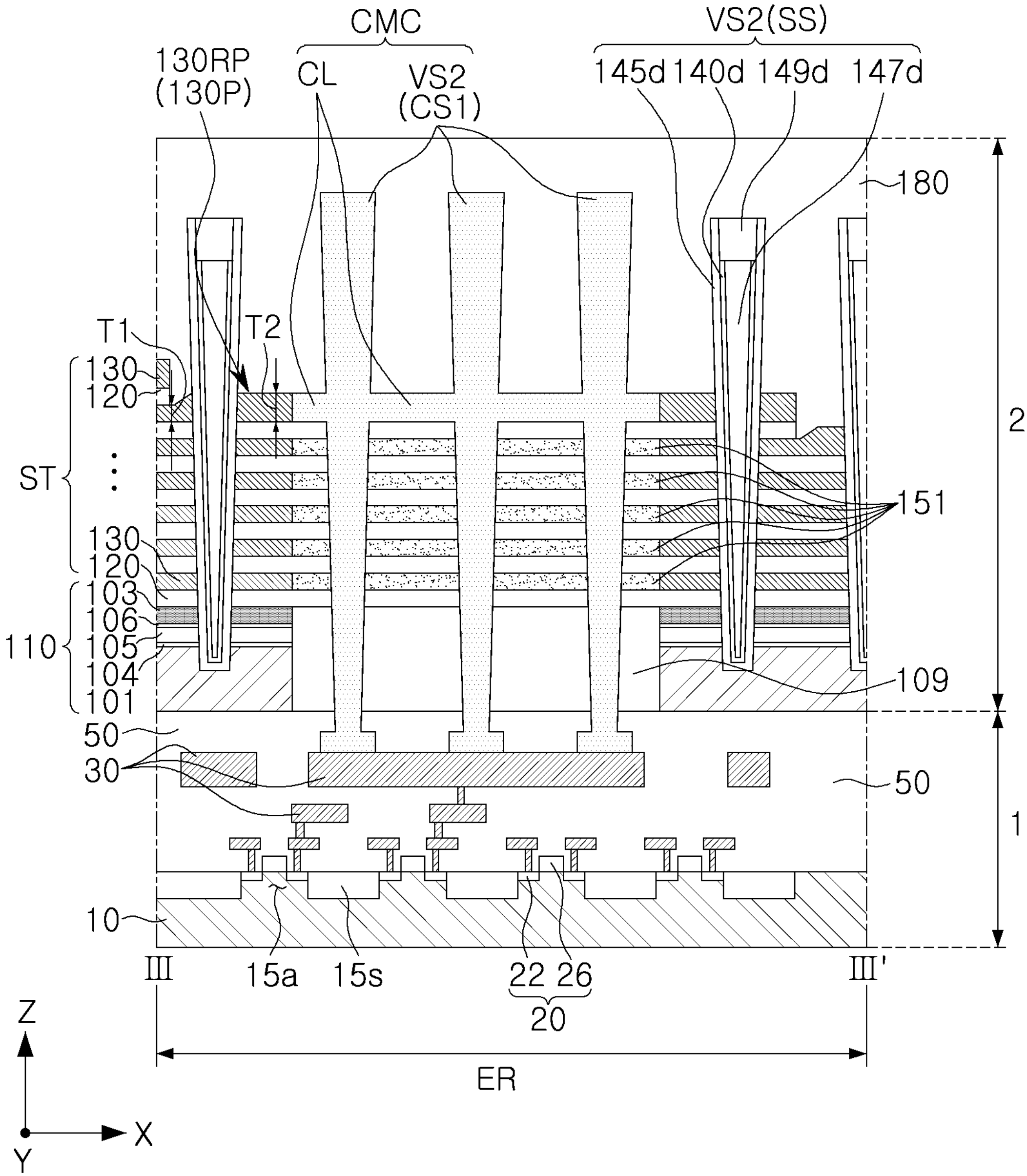
FIG. 6B is a schematic cross-sectional view of a semiconductor device according to example embodiments.

FIG. 6B is a schematic cross-sectional view of a semiconductor device according to example embodiments. FIG. 6B illustrates a cross-section taken along line III-III' in FIG. 6A.

Referring to FIGS. 6A and 6B, the second vertical structures VS2 may include first contact structures CS1 between the support structures SS. The first contact structures CS1 may form a group and may be connected together with one of the gate electrodes 130 to provide one gate contact plug CMC. For example, one gate contact plug CMC may include a cluster of first contact structures CS1 electrically connected to each other. The first contact structures CS1 may be arranged in a hexagonal shape. The first contact structures CS1 may have a continuous arrangement with the support structures SS. As illustrated in FIG. 1A, the first contact structures CS1 may be arranged at a pitch PBa substantially equal to a second pitch PB of the support structures SS in the X direction, and may have a diameter WBa substantially equal to a second diameter WB of the support structures SS.

The first contact structures CS1 may extend below a lower surface of the source structure 110 to be connected to one of the lower interconnections 30. The first contact structures CS1 may pass through a lower insulating layer 109 that penetrates through the source structure 110, in the Z direction. The first contact structures CS1 may be connected to the one gate electrode 130 and may be electrically insulated from the gate electrodes 130 that are disposed to be lower than the one gate electrode 130. First insulating patterns 151 may be disposed between the first contact structures CS1 and the gate electrodes 130 may be electrically insulated from the first contact structures CS1.

One gate contact plug CMC may include a contact extension CL extending horizontally between the first contact structures CS1 constituting one group. The one gate electrode 130 may include a contact pad region 130RP having a relatively increased thickness, and the contact extension CL may be directly connected to the contact pad region 130RP. In the contact pad region 130RP, the thickness of the gate electrode 130 may be increased in a manner that is constant at the level of the lower surface and increases at the level of the upper surface. As illustrated in FIG. 6B, the gate electrodes 130 may extend to a first thickness T1, and may have a second thickness T2 greater than the first thickness T1 in the contact pad region 130RP.

The contact extensions CL may surround the first contact structures CS1 and may electrically connect the first contact structures CS1 to each other. The contact extension CL may expand from the first contact structures CS1 to have a wavy-shaped side surface in plan view. For example, the contact extension CL may have a floral pattern in a plan view.

FIGS. 7A to 7G are schematic partial enlarged plan views of semiconductor devices according to example embodiments. FIGS. 7A to 7G illustrate an enlarged area corresponding to area 'A' in FIG. 1A.

Figure 7A:
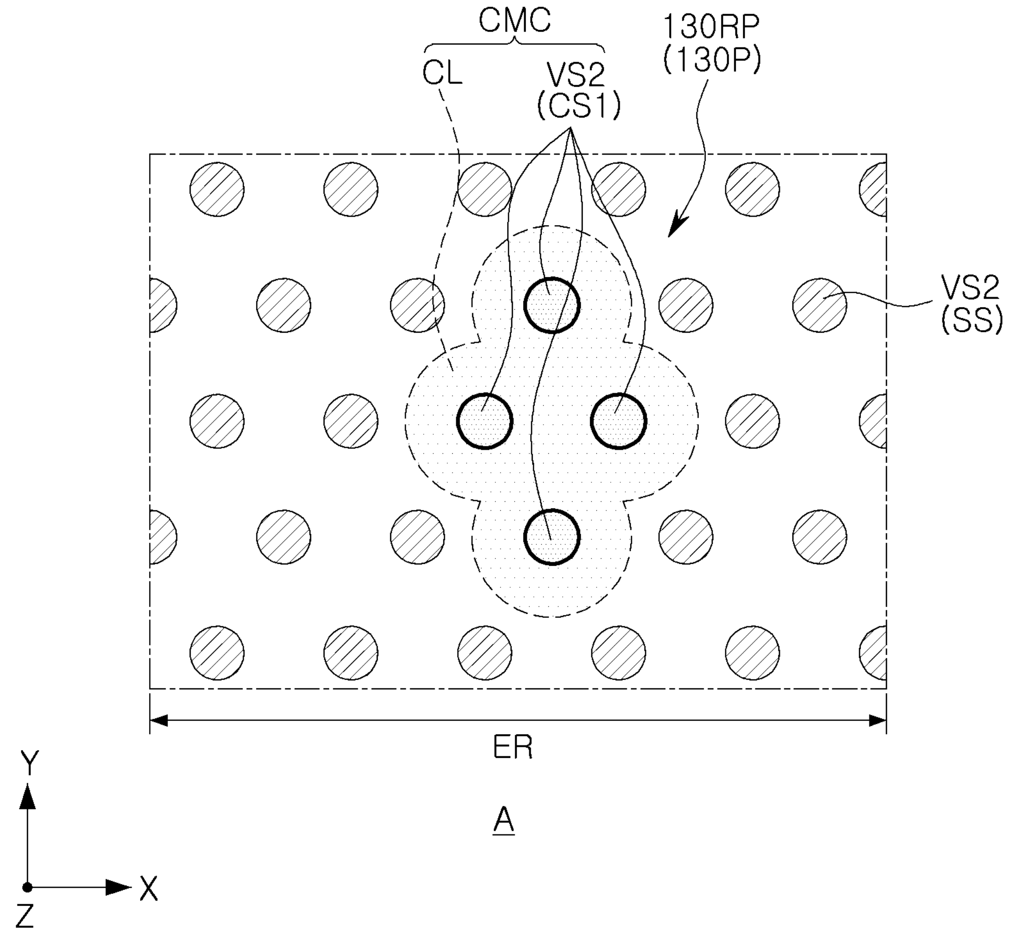
FIGS. 7A, 7B, 7C, 7D, 7E, 7F and 7G are schematic partial enlarged plan views of semiconductor devices according to example embodiments.

Referring to FIG. 7A, first contact structures CS1 constituting one gate contact plug CMC may be arranged in a diamond shape.

Figure 7B:
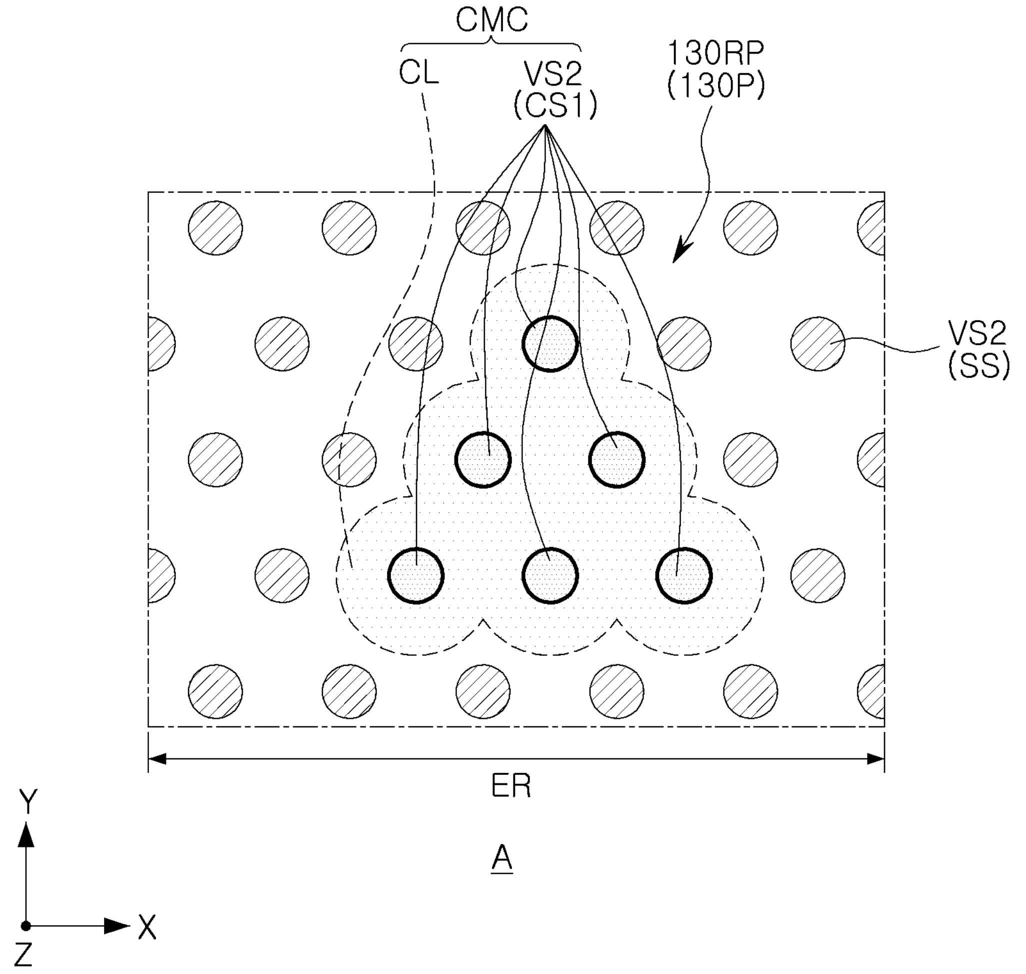

Referring to FIG. 7B, first contact structures CS1 constituting one gate contact plug CMC may be arranged in a triangular shape.

Figure 7C:
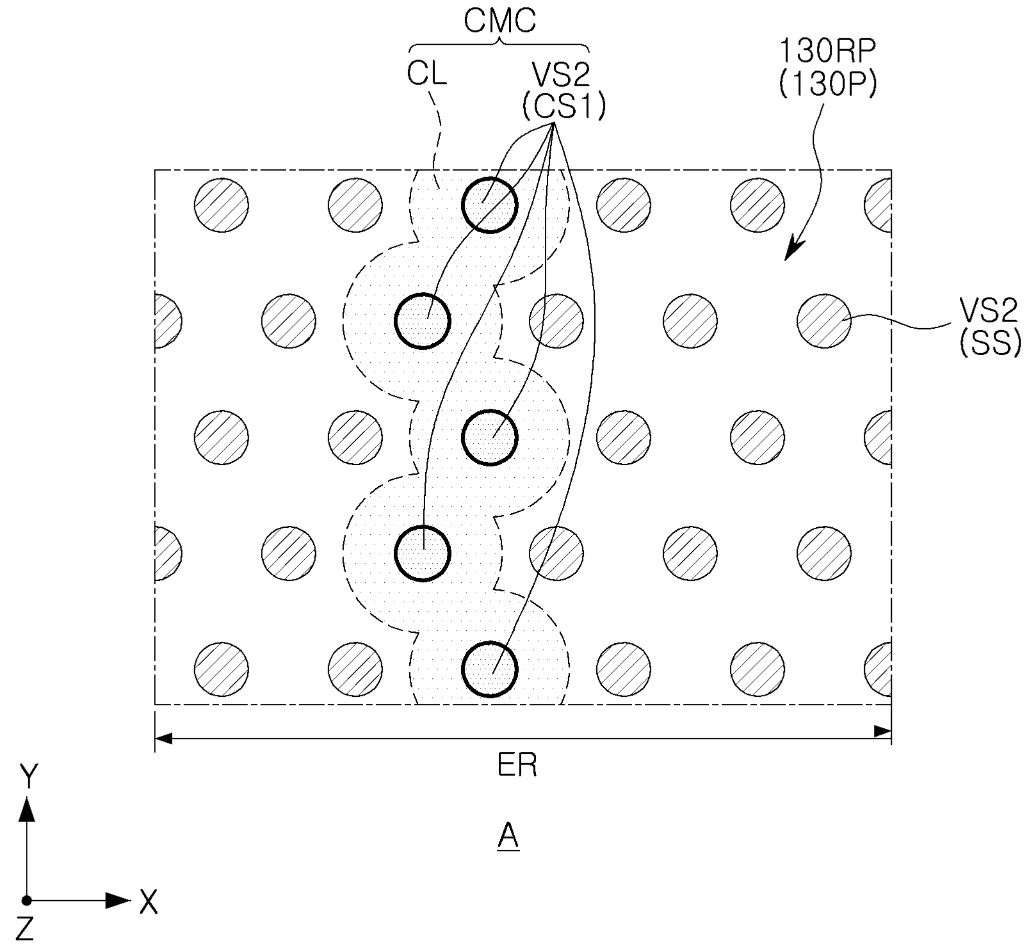

Referring to FIG. 7C, first contact structures CS1 constituting one gate contact plug CMC may be arranged in a zigzag arrangement in the X direction when viewed in the Y direction. Alternatively, the first contact structures CS1 may be arranged in a 'W' shape.

Figure 7D:
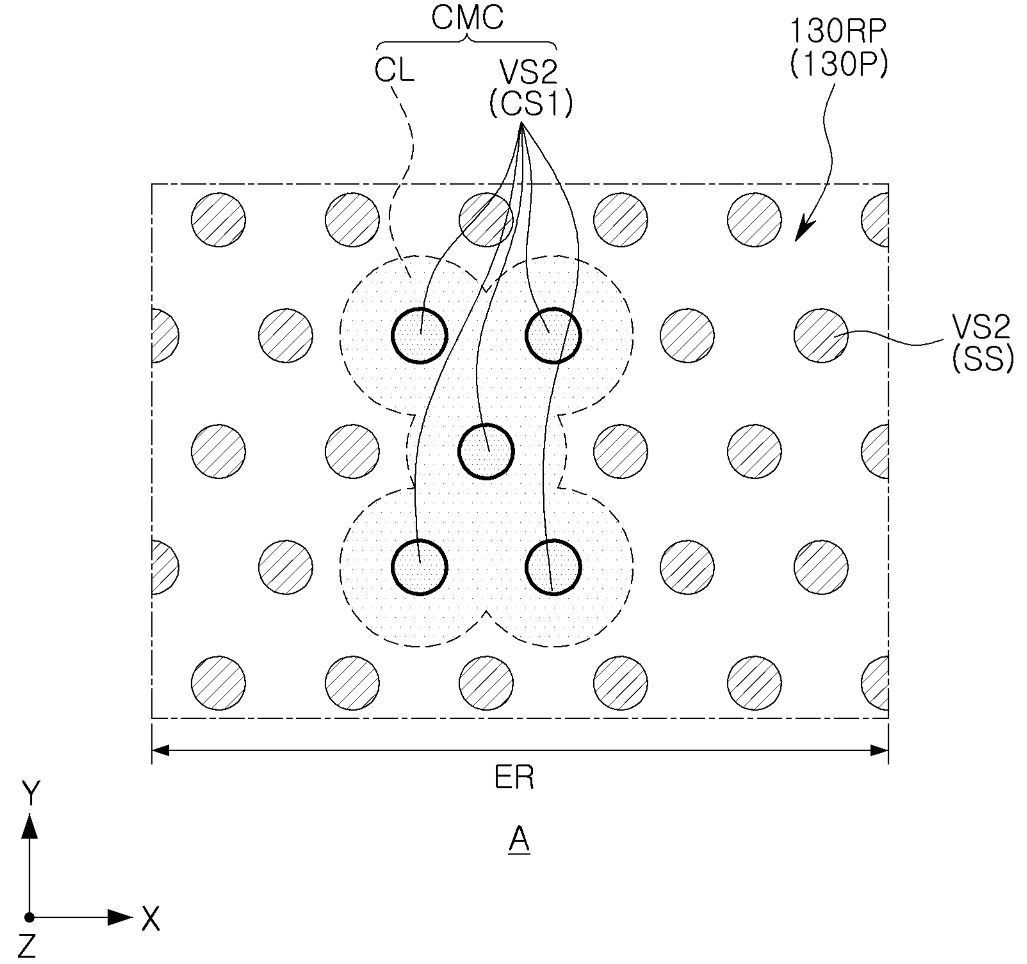

Referring to FIG. 7D, first contact structures CS1 constituting one gate contact plug CMC may be arranged in an 'X' shape.

Figure 7E:
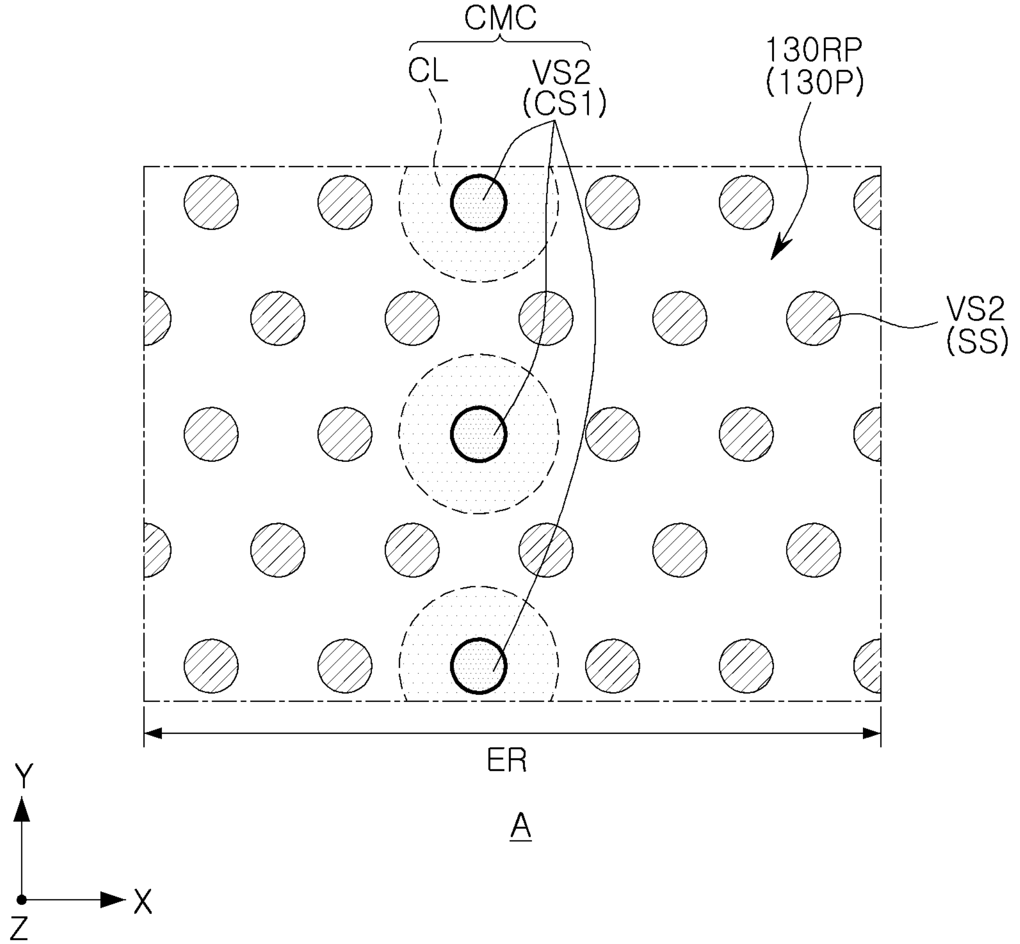

Referring to FIG. 7E, first contact structures CS1 constituting one gate contact plug CMC may be arranged in a line in the Y direction. The contact extensions CL constituting one gate contact plug CMC may be separated from each other, but may be combined with each other according to example embodiments.

In FIGS. 7A to 7E, the contact extensions CL may have wavy side surfaces corresponding to the arrangement shape of the first contact structures CS1.

Figure 7F:
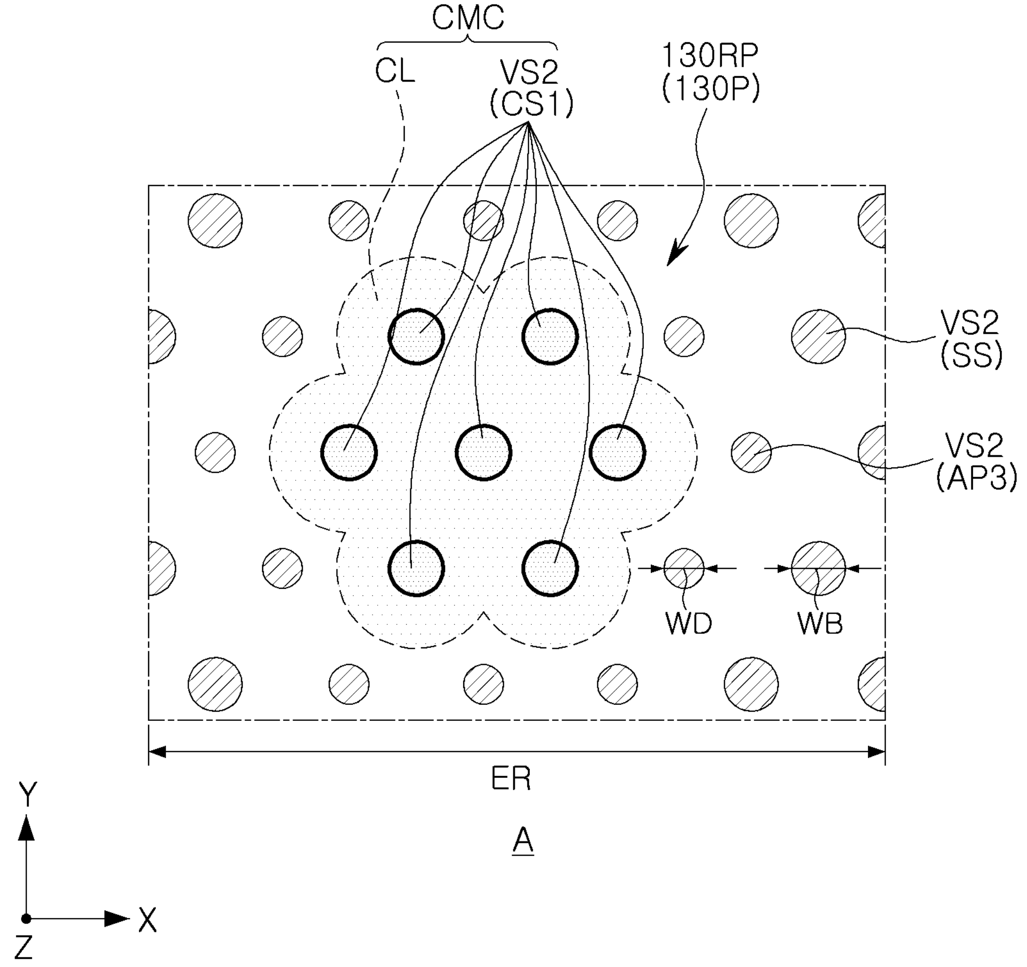

Referring to FIG. 7F, the second vertical structures VS2 may further include auxiliary patterns AP3 between the support structures SS and the first contact structures CS1. The auxiliary patterns AP3 may have a diameter WD that is less than the diameter WB of the support structures SS, and lower ends of the auxiliary patterns AP3 may be located at a higher level than the lower ends of the support structures SS. The description of the auxiliary patterns AP3 may be the same as or similar to the description of the auxiliary patterns AP of FIGS. 2A to 2C.

Figure 7G:
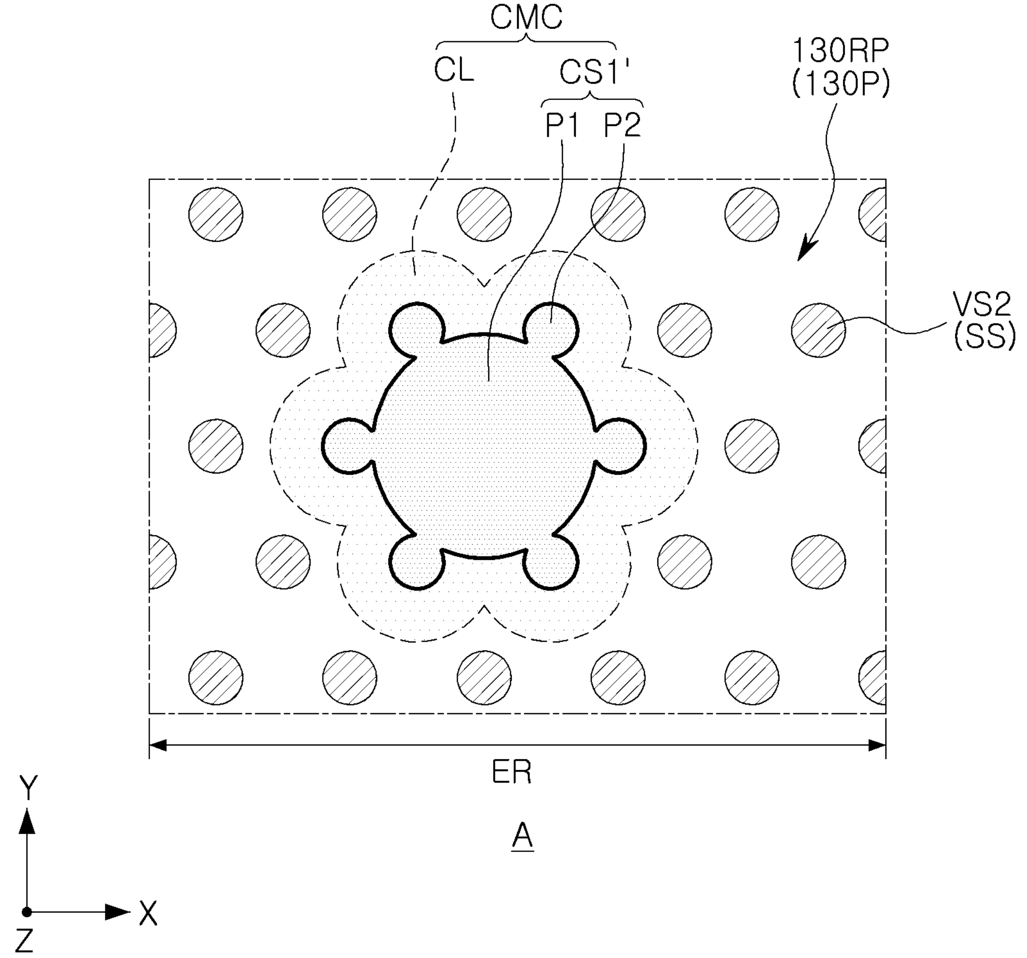

Referring to FIG. 7G, a first contact structure CS1' may be formed by expanding a contact hole disposed in the center and merging the expanded contact hole with adjacent contact holes. The first contact structure CS1' may include a first pattern portion P1 having a relatively great diameter, and second pattern portions P2 connected to the first pattern portion P1, around the periphery of the first pattern portion P1, and having a relatively small diameter. The contact extensions CL may have wavy side surfaces corresponding to the arrangement shape of the first contact structure CS1'.

Figure 8A:
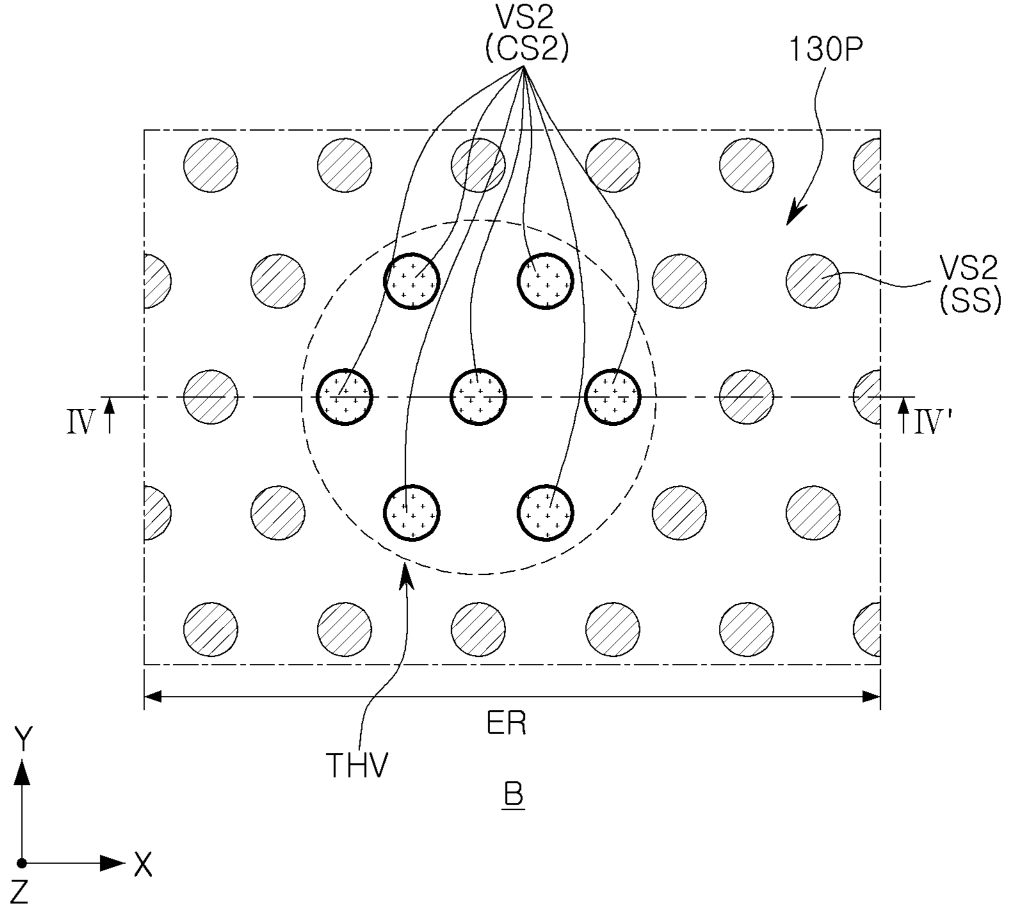
FIG. 8A is a schematic partially enlarged plan view of a semiconductor device according to example embodiments.

FIG. 8A is a schematic partially enlarged plan view of a semiconductor device according to example embodiments. FIG. 8A is an enlarged view of area 13' of FIG. 1.

Figure 8B:
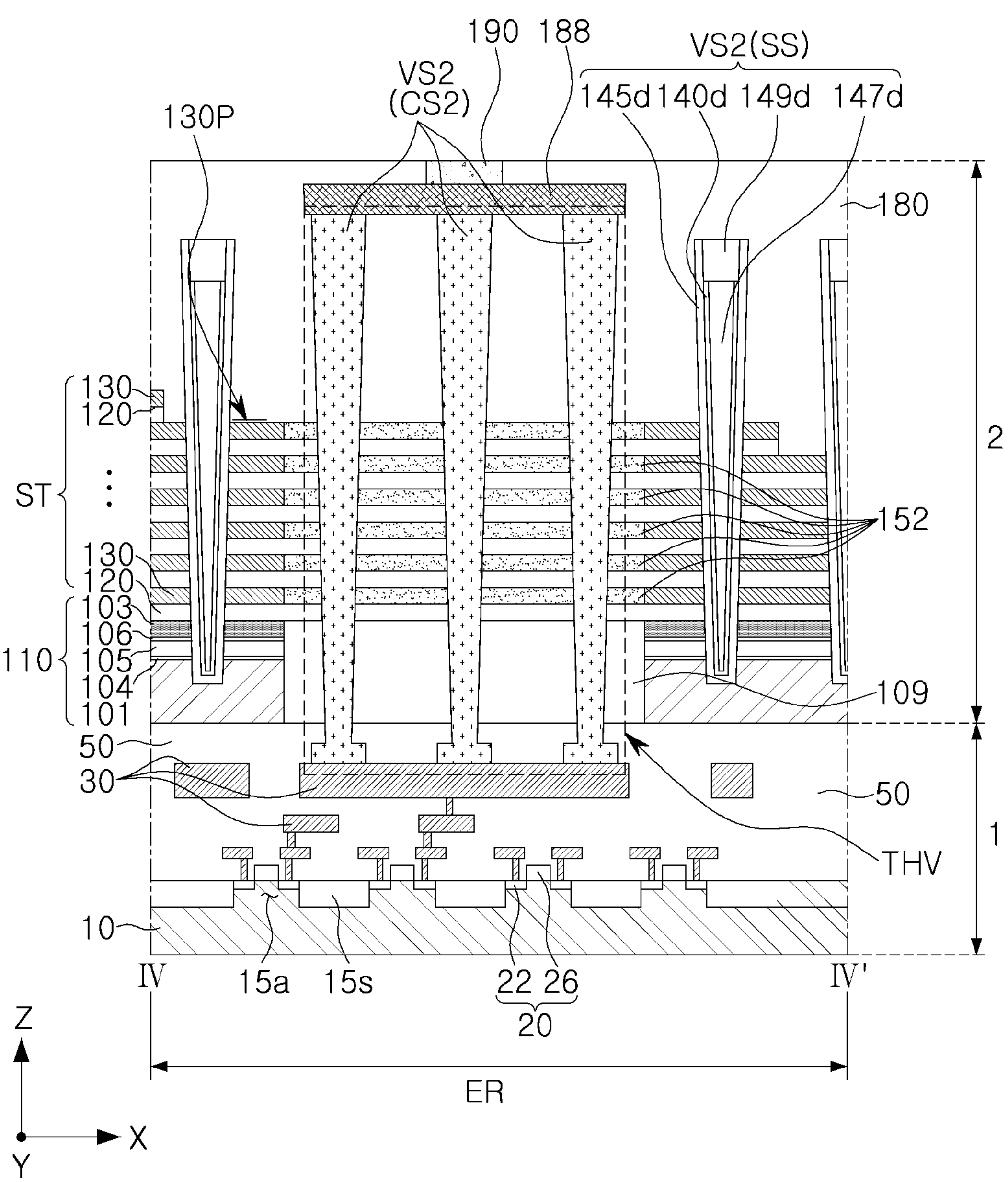
FIG. 8B is a schematic cross-sectional view of a semiconductor device according to example embodiments.

FIG. 8B is a schematic cross-sectional view of a semiconductor device according to example embodiments. FIG. 8B illustrates a cross-section taken along line IV-IV' in FIG. 8A.

Referring to FIGS. 8A and 8B, the second vertical structures VS2 may include second contact structures CS2 between the support structures SS. The second contact structures CS2 form a group and are electrically insulated from the gate electrodes 130, and may be connected together with one lower interconnection 30 among the lower interconnections 30 to form one through contact plug THV. For example, one through contact plug THV may include a group of second contact structures CS2 electrically connected to each other. The second contact structures CS2 may be arranged in a hexagonal shape, but example embodiments are not limited thereto, and may have an arrangement or shape similar to the arrangement or shape of the contact structures illustrated in FIGS. 7A to 7G. The second contact structures CS2 may have a continuous arrangement with the support structures SS. As illustrated in FIG. 1A, the second contact structures CS2 may be arranged at a pitch PBb substantially equal to the second pitch PB of the support structures SS in the X direction, and may have a diameter WBb substantially equal to the second diameter WB of the support structures SS.

The second contact structures CS2 may pass through the lower insulating layer 109 penetrating through the source structure 110, in the Z direction. The second contact structures CS2 may be electrically insulated from the gate electrodes 130. Second insulating patterns 152 may be disposed between the second contact structures CS2 and the gate electrodes 130. In the region in which the second contact structures CS2 are disposed, the contact pad regions 130PR with increased thickness may not be formed in the pad regions 130P of the gate electrodes 130. Accordingly, the second contact structures CS2 may be spaced apart from the gate electrodes 130 by the second insulating patterns 152.

A contact stud 188 connected to the second contact structures CS2 may be disposed on the second contact structures CS2. The contact stud 188 may be connected to the upper interconnection 190. Although the second contact structures CS2 are illustrated as being disposed on the second region ER, the second contact structures CS2 may be disposed on the first region CR according to some example embodiments, and may also be disposed outside of first and second regions CR and ER to be connected to the lower interconnections 30.

Figure 9A:
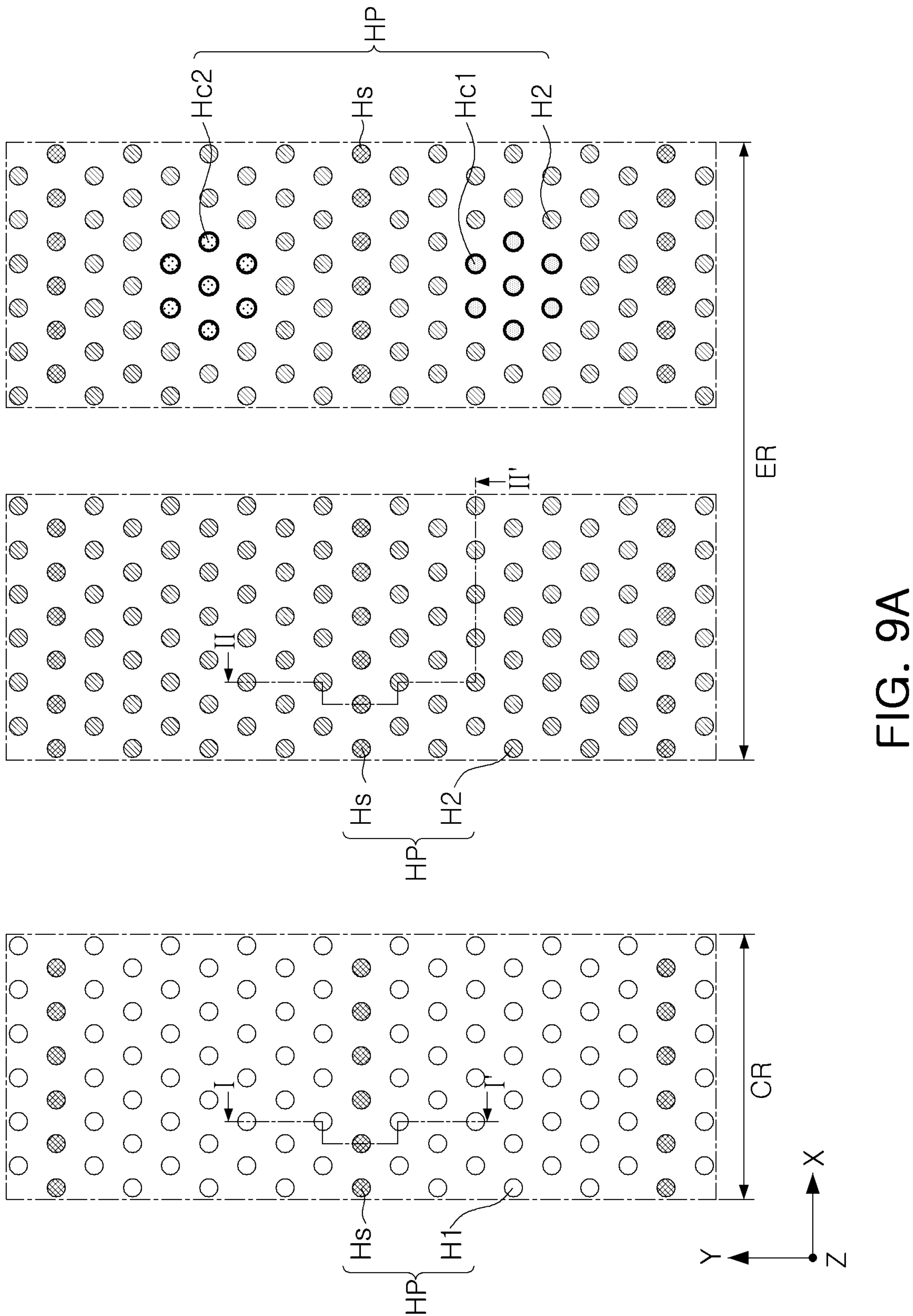
FIGS. 9A, 9B, 10A, 10B and 11 are schematic views illustrating a method of manufacturing a semiconductor device according to example embodiments.
Figure 9B:
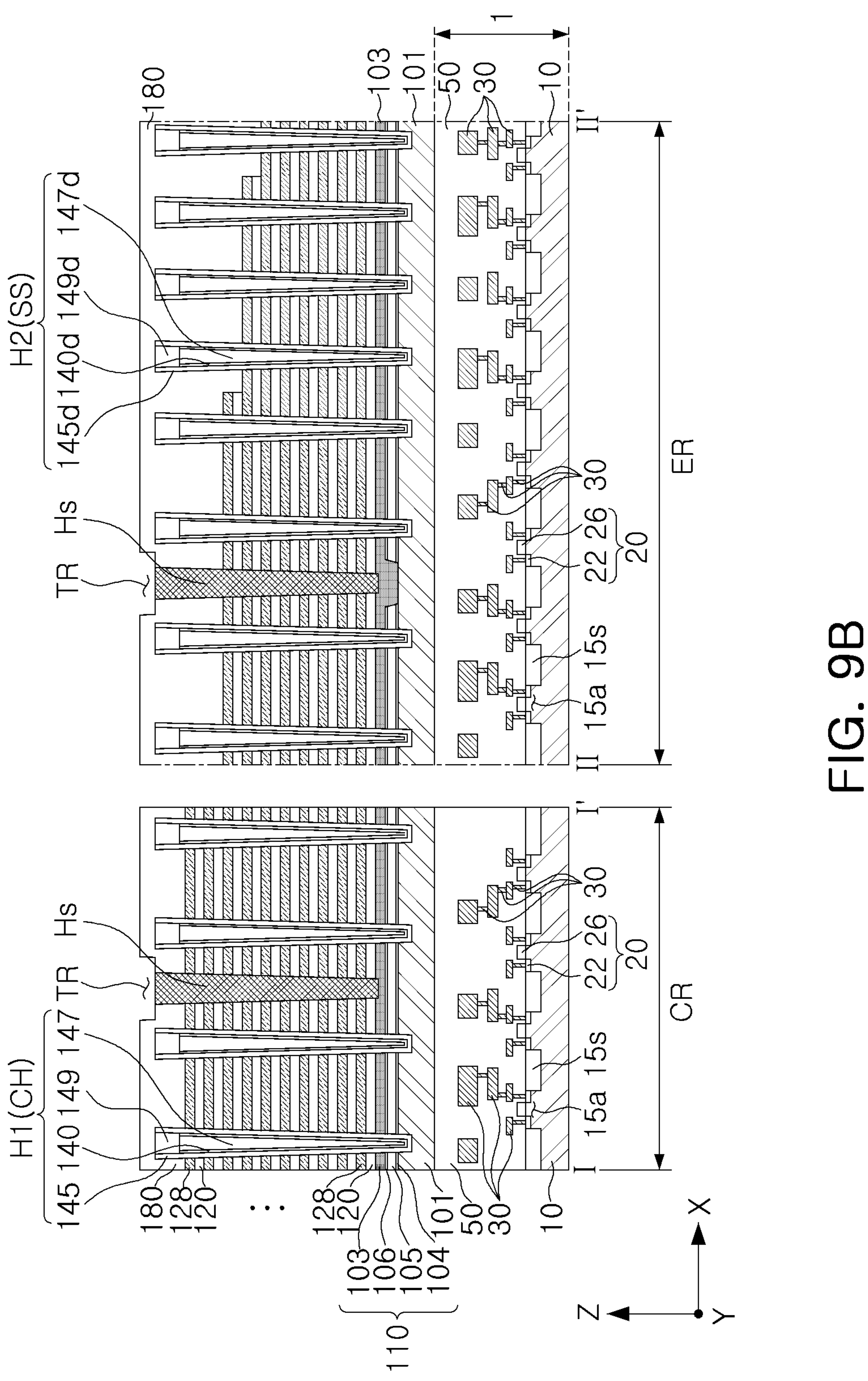
Figure 10A:
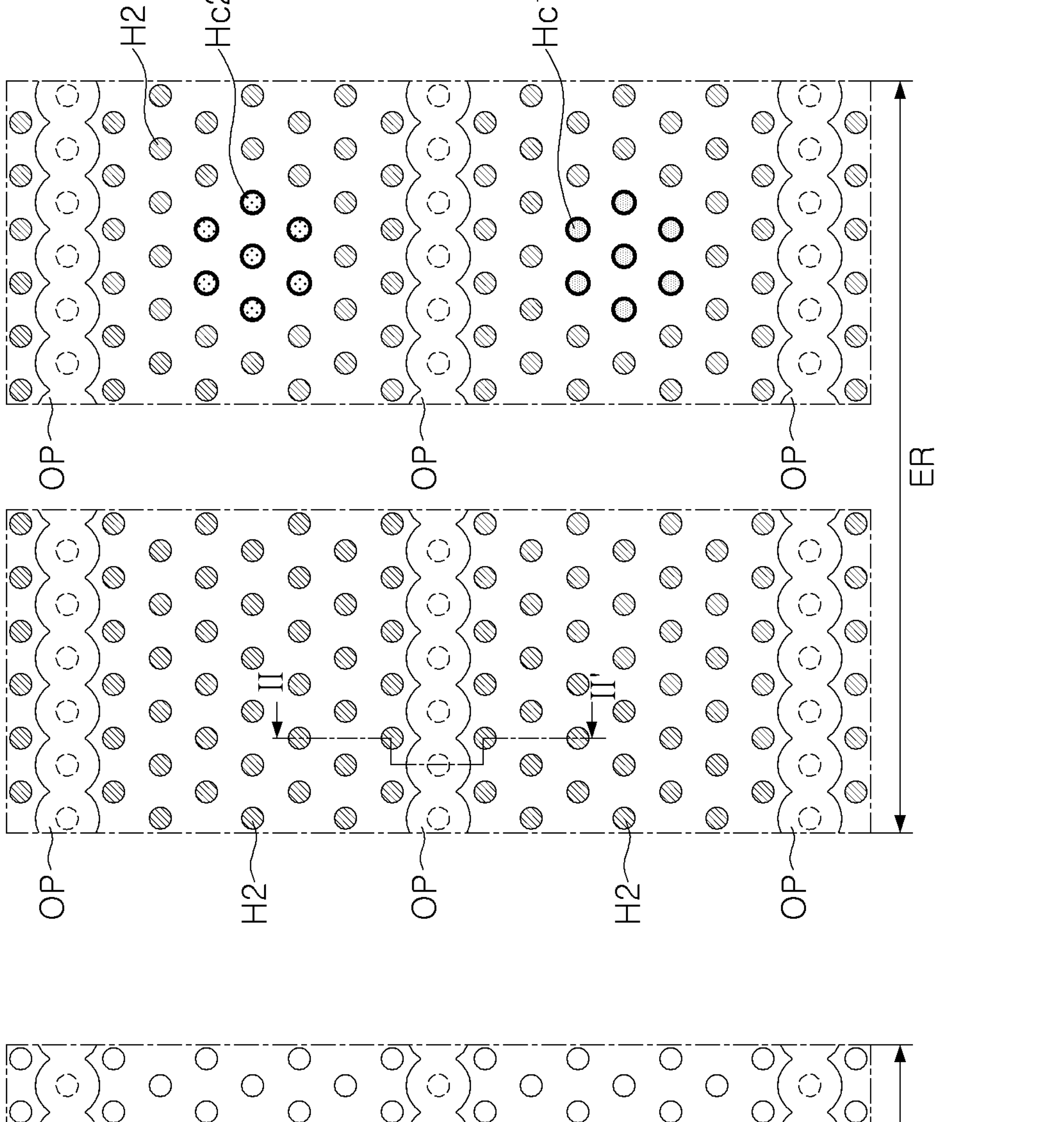
Figure 10B:
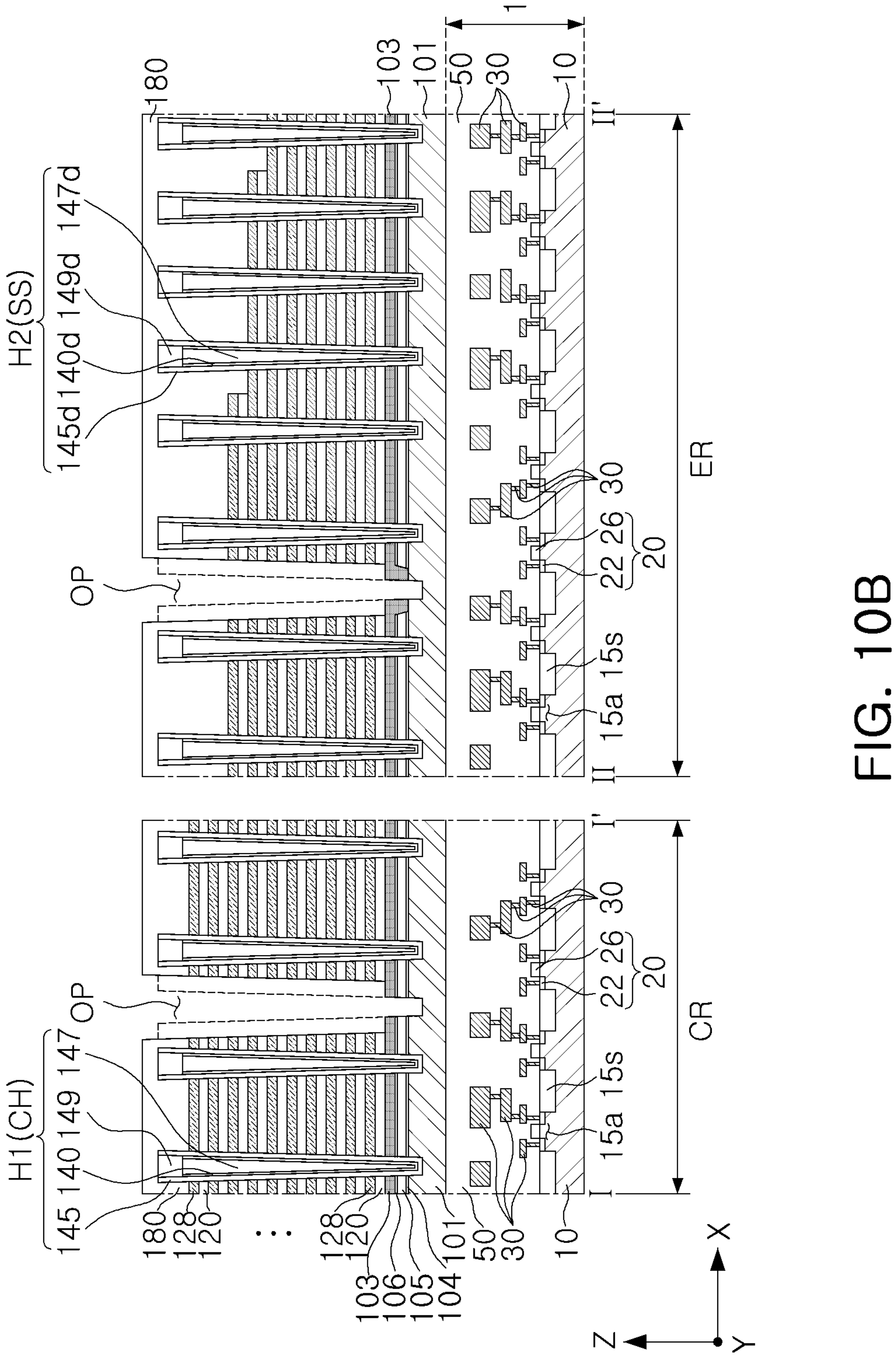
Figure 11:
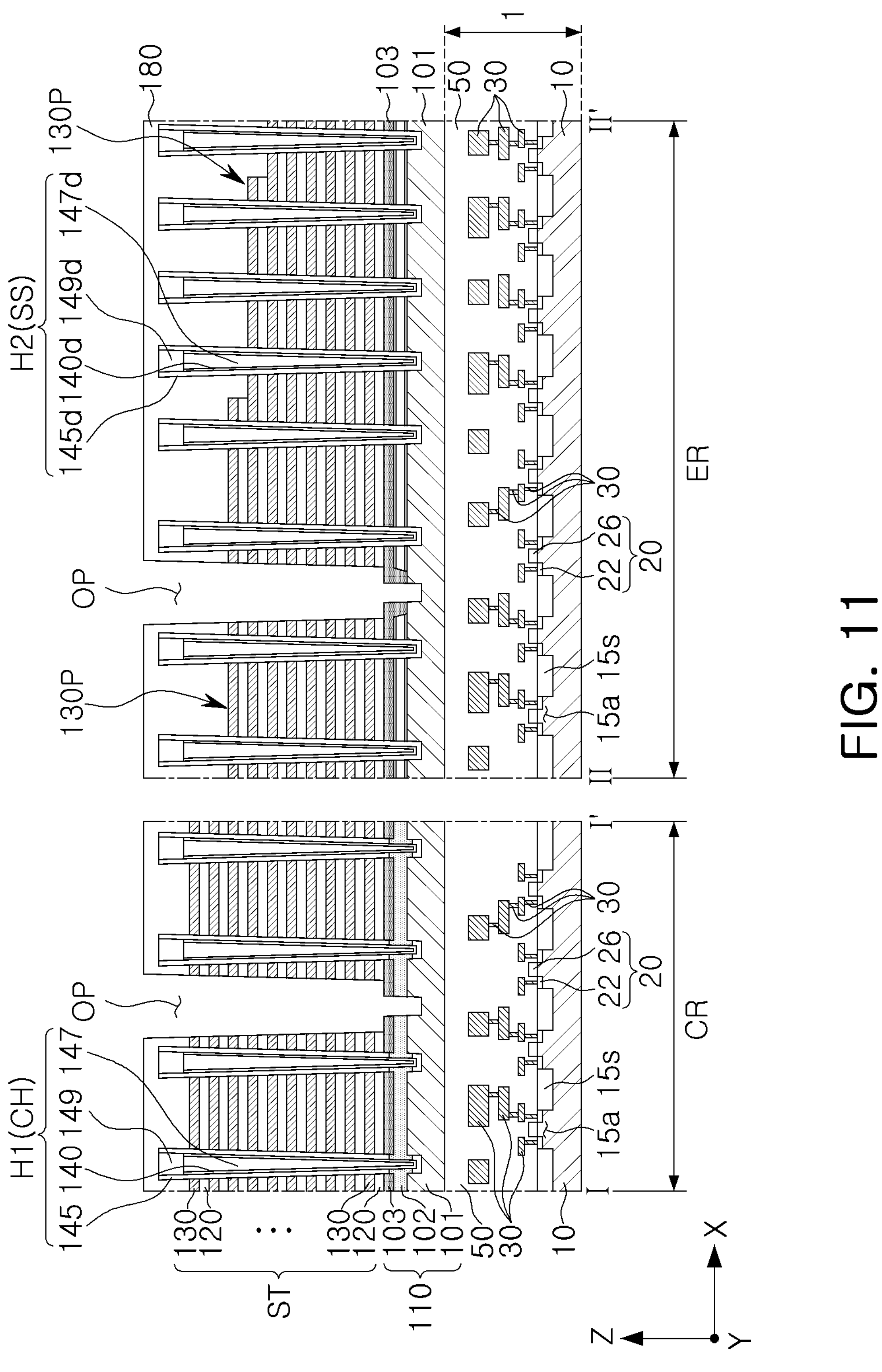

FIGS. 9A to 12 are schematic views illustrating a method of manufacturing a semiconductor device according to example embodiments. Specifically, FIGS. 9A and 10A are schematic plan views illustrating a method of manufacturing a semiconductor device according to example embodiments, FIG. 9B illustrates cross-sections taken along lines I-I' and II-II' of FIG. 9A, and FIG. 10B illustrates cross-sections taken along lines I-I' and II-II' of FIG. 10A. FIGS. 11 and 12 illustrate regions corresponding to the cross-sections in FIG. 1B.

Referring to FIGS. 9A and 9B, a first structure 1 may be formed, a source structure 110 may be formed on the first structure 1, interlayer insulating layers 120 and sacrificial layers 128 may be alternately stacked on the source structure 110, vertical hole patterns HP penetrating through a mold structure of the interlayer insulating layers 120 and the sacrificial layers 128 may be formed, and upper portions of separation hole patterns Hs among the vertical hole patterns HP may be opened.

The first structure 1 may be formed by forming the circuit elements 20 and lower interconnections 30 on the substrate 10.

First, device isolation layers 15*s* may be formed in the substrate 10, and circuit gates 26 and source/drain regions 22 may be formed on an active region 15*a* on the substrate 10. The device isolation layers 15*s* may be formed by a shallow trench isolation (STI) process. The dielectric layer of the circuit gate 26 may include silicon oxide or a high dielectric material, and the circuit gate electrode of the circuit gate 26 may include at least one of polycrystalline silicon, a metal, a metal nitride, or a metal-semiconductor compound. Additionally, spacer layers covering both sides of the circuit gate 26 may be formed.

The lower interconnections 30 may be formed by forming a portion of the lower capping insulating layer 50 and then partially etching and removing the same, and by filling with a conductive material or depositing a conductive material and then patterning the same, and then, by filling the area removed by patterning with a portion of the lower capping insulating layer 50.

The source structure 110 may be formed on the lower capping insulating layer 50. The source structure 110 may include a base pattern 101, source sacrificial layers 104, 105, and 106, and a second pattern 103, and the source sacrificial layers 104, 105 and 106 in the first region CR may be replaced with the first pattern 102 in a subsequent process. The second pattern 103 may include a portion bent to contact the base pattern 101 in the second region ER.

The interlayer insulating layers 120 and the sacrificial layers 128 may be alternately stacked to form a mold structure.

The sacrificial layers 128 may be at least partially replaced with the gate electrodes 130 (refer to FIG. 1B) in a subsequent process. The sacrificial layers 128 may be formed of a material different from that of the interlayer insulating layers 120, and may be formed of a material that may be etched with etch selectivity for the interlayer insulating layers 120 under specific etching conditions. For example, the sacrificial layers 128 may be formed of silicon nitride, and the interlayer insulating layers 120 may be formed of silicon oxide.

The photolithography process and the etching process for the sacrificial layers 128 may be repeatedly performed using a mask layer such that the lower sacrificial layers 128 extend farther than the upper sacrificial layers 128 in the second region ER. Accordingly, the sacrificial layers 128 may form a stepped structure in a step shape in a predetermined unit on the second region ER. By further forming sacrificial layers on the sacrificial layers 128 forming the step structure, sacrificial pad regions having increased thickness (refer to '128RP' in FIG. 12A) may be formed. The sacrificial pad regions may be replaced with the contact pads 130RP of FIG. 6B through a subsequent process. A portion of the upper capping insulating layer 180 may be formed on the mold structure.

Vertical hole patterns HP passing through the mold structure may be formed. To form the vertical hole patterns HP, a patterning process may be performed on the entire surface of the substrate 10. The patterning process may include forming a mask layer having a plurality of openings and performing an anisotropic etching process using the mask layer as an etch mask. Examples of the anisotropic etching process include plasma etching, reactive ion etching (RIE), inductively coupled plasma reactive ion etching (ICP-RIE), or ion beam etching (IBE) process. The vertical hole pattern HP may refer to an empty space that has not yet been filled after patterning, or may refer to a structure in which a sacrificial layer, an insulating layer, or a conductive layer is deposited after patterning.

As illustrated in FIG. 9A, the vertical hole patterns HP may be formed to be spaced apart from each other while forming rows and columns. The vertical hole patterns HP may have a lattice arrangement. The vertical hole patterns HP may be formed to have a continuous arrangement on the first region CR and the second region ER. For example, the vertical hole patterns HP on the second region ER may have the same lattice configuration as the vertical hole patterns HP on the first region CR. As the designs of the patterns on the first and second regions CR and ER are the same as each other, a loading effect generated during the etching process may be alleviated, and thus, continuous and uniform patterning may be obtained, thereby improving patterning dispersion.

The vertical hole patterns HP may include first hole patterns HE second hole patterns H2, separation hole patterns Hs, and contact hole patterns Hc1 and Hc2. The first hole patterns HE the second hole patterns H2, the separation hole patterns Hs, and the contact hole patterns Hc1 and Hc2 may all have a continuous arrangement.

The first hole patterns H1 may be formed on the first region CR. The channel structures CH may be formed by sequentially forming the gate dielectric layer 145, the channel layer 140, the core insulating layer 147, and the channel pad 149 on the first hole patterns H1. The second hole patterns H2 may be formed on the second region ER. Support structures SS may be formed by sequentially forming a support dielectric layer 145*d*, a support channel layer 140*d*, a support core insulating layer 147*d*, and a support channel pad 149*d* on the second hole patterns H2. Before forming the channel structures CH and the support structures SS, the first and second hole patterns H1 and H2 may be further etched, such that the first and second hole patterns H1 and H2 penetrate through the second pattern 103 and the source sacrificial layers 104, 105 and 106 and the lower ends thereof may be positioned at a level lower than the upper surface of the base pattern 101.

The separation hole patterns Hs may be arranged in a line in the X direction, and the inside thereof may be filled with a sacrificial layer, respectively. The contact hole patterns Hc1 and Hc2 may be formed into the contact structures CS1 and CS2 of FIGS. 6B and 8B through the process operations of FIGS. 13A to 13C, in a state in which the inside thereof is respectively filled with a sacrificial layer.

After a portion of the upper capping insulating layer 180 is formed, trenches TR extending in the X direction may be formed to expose the separation hole patterns Hs. An upper surface of the sacrificial layer of the separation hole patterns Hs may be exposed by the trenches TR.

Referring to FIGS. 10A and 10B, separation openings OP may be formed by expanding the separation hole patterns Hs through the trenches TR. After selectively removing the sacrificial layer in the separation hole patterns Hs, an isotropic etching process may be performed to expand each separation hole pattern Hs. The separation hole patterns Hs arranged in the X direction may be connected to each other due to the isotropic etching process to form the separation openings OP extending in the X direction. The side surfaces of the separation openings OP may have an uneven shape, for example, a wavy shape or an embossed shape. The separation openings OP may contact at least one of adjacent first hole patterns H1 and second hole patterns H2.

After the separation hole patterns Hs are expanded, spacers may be formed on inner walls of the expanded separation hole patterns Hs, and an etching process may be performed between the spacers to remove a portion of the second pattern 103 and a portion of the source sacrificial layers 104, 105 and 106 to expose the base pattern 101.

Referring to FIG. 11, after replacing the source sacrificial layers 104, 105, and 106 in the first region CR with the first pattern 102 and removing the sacrificial layers 128, the gate electrodes 130 may be formed by filling the region from which the sacrificial layers 128 have been removed with a conductive material.

First, during the process of removing the source sacrificial layers 104, 105, and 106, a portion of the gate dielectric layer 145 exposed in the region from which the source sacrificial layer 105 has been removed may also be removed. The first pattern 102 may be formed by depositing a conductive material in the region in which the source sacrificial layers 104, 105, and 106 are removed.

The sacrificial layers 128 may be selectively removed with respect to the interlayer insulating layers 120. The selective removal process of the sacrificial layers 128 may use a wet etching process. The conductive material forming the gate electrodes 130 may include metal, polycrystalline silicon, or a metal-semiconductor compound.

Thereafter, an insulating material may be deposited in the isolation openings OP to form separation patterns SP, an upper capping insulating layer 180 may be formed, and upper interconnections 190 may be formed, thereby manufacturing the semiconductor device 100.

Figure 12A:
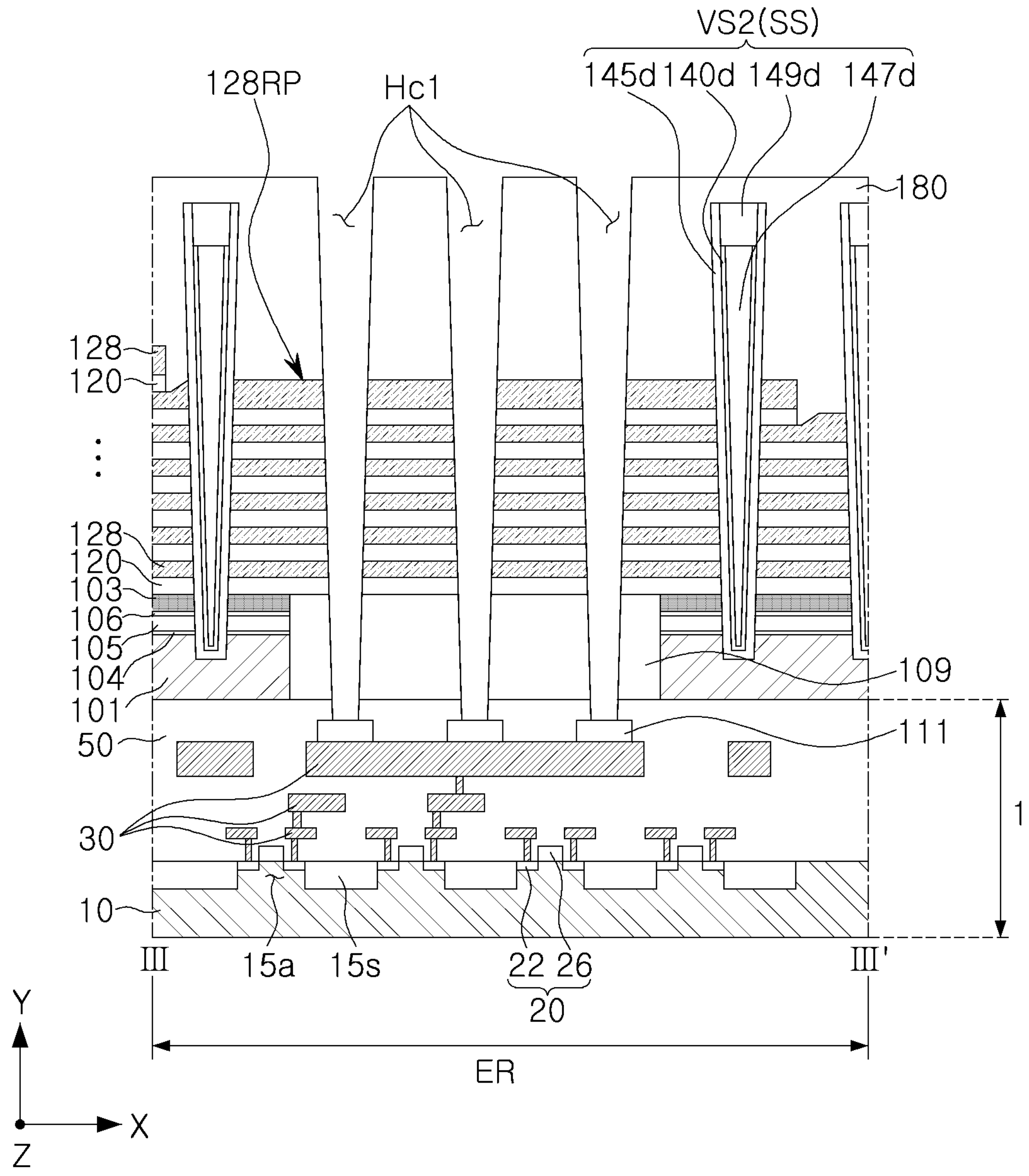
FIGS. 12A, 12B and 12C are schematic views illustrating a method of forming contact structures of a semiconductor device according to example embodiments.
Figure 12B:
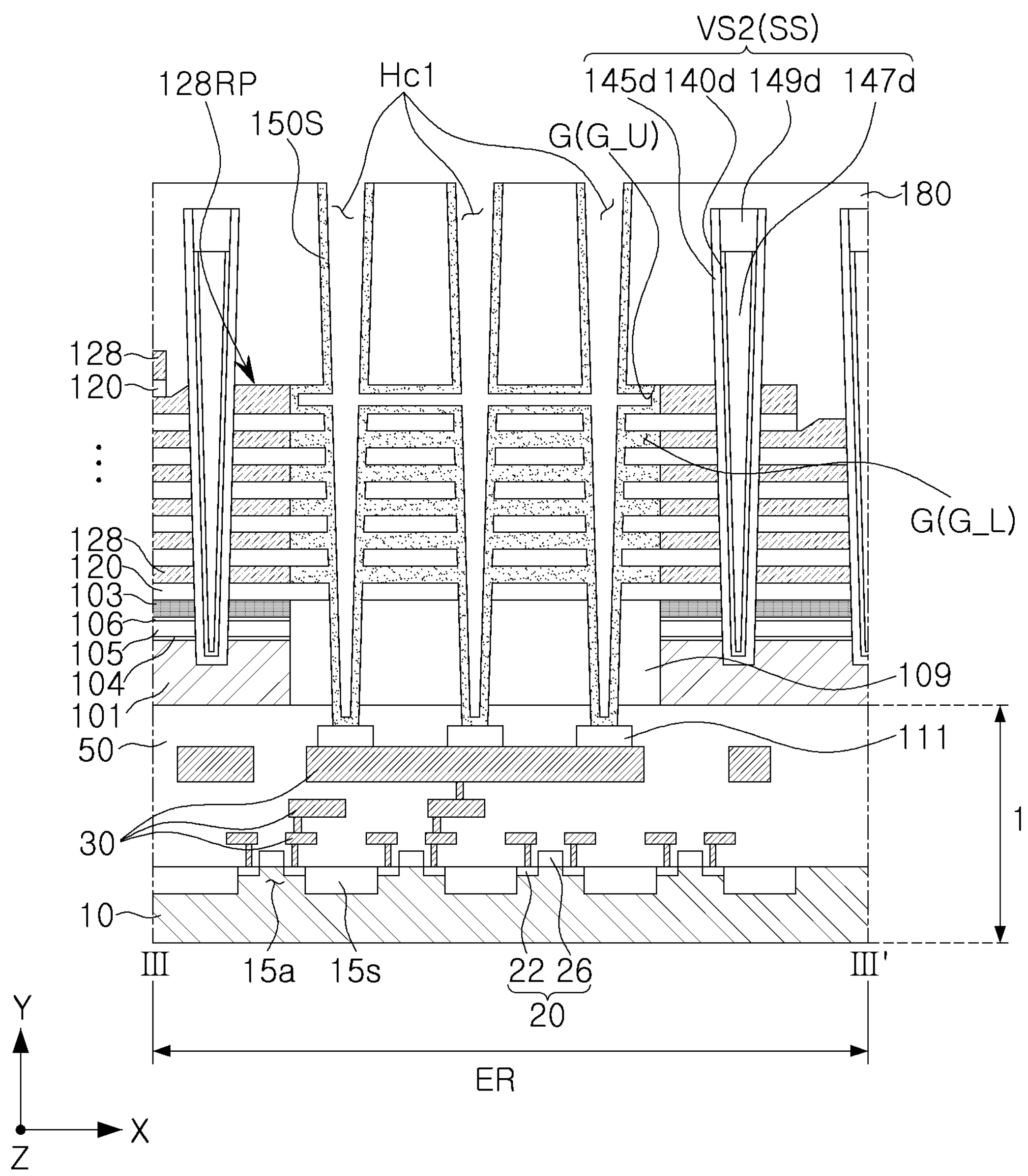
Figure 12C:
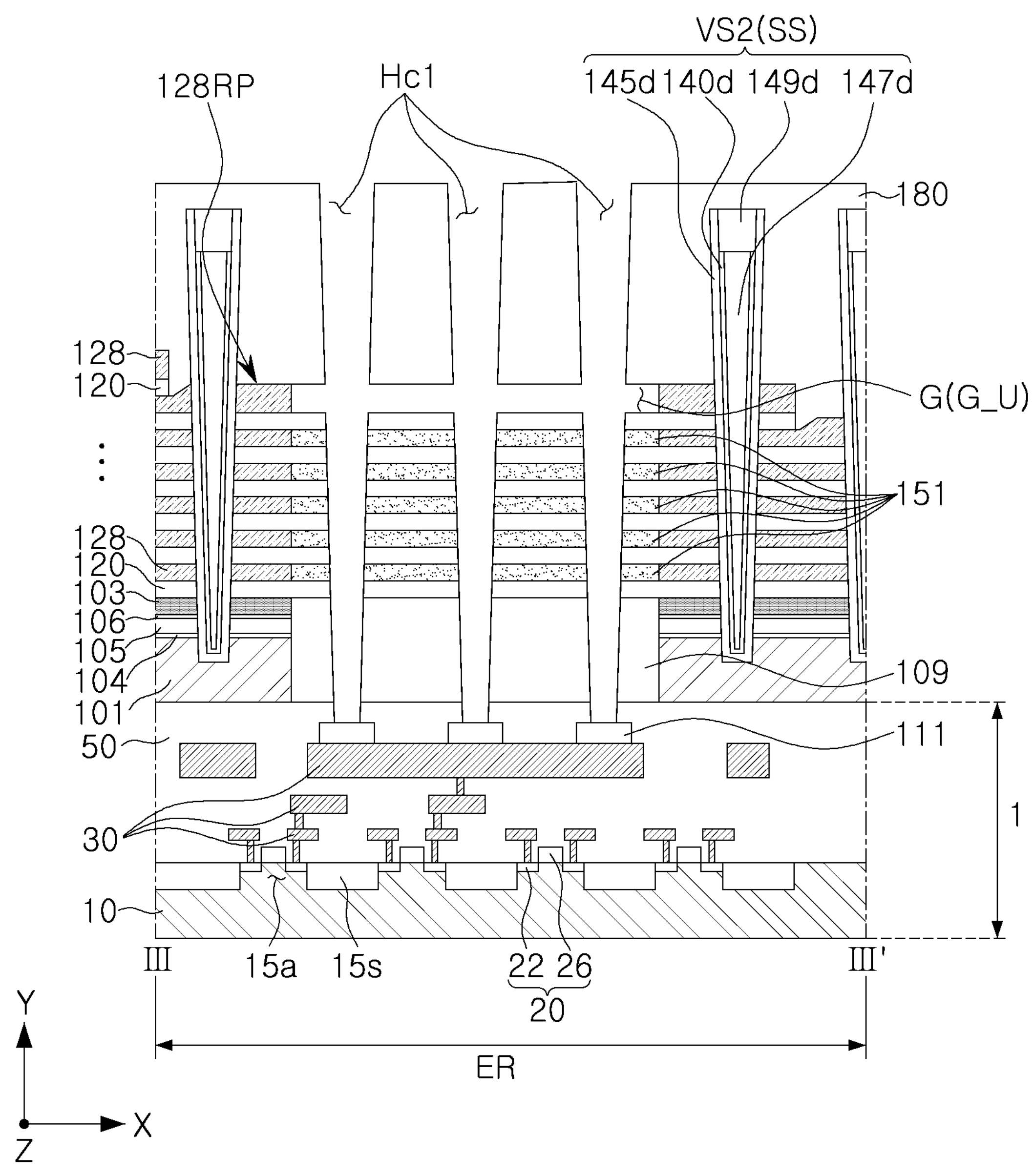

FIGS. 12A to 12C are schematic views illustrating a method of forming contact structures of a semiconductor device according to example embodiments. FIGS. 12A to 12C illustrate a method of forming the contact structures of FIGS. 6A and 6B.

Referring to FIG. 12A, the sacrificial layer filling the first contact hole patterns Hc1 may be removed. The first contact hole patterns Hc1 may penetrate through the lower insulating layer 109 to expose the via pattern 111 on the lower interconnections 30.

Referring to FIG. 12B, the sacrificial layers 128 exposed by the first contact hole patterns Hc1 may be partially etched to form expansion spaces G horizontally extending from the first contact hole patterns Hc1, and a buffer insulating layer 150S may be formed on the first contact hole patterns Hc1 and the expansion spaces G. An expansion space G_U formed in preliminary contact pad regions 128RP in which the thickness of the sacrificial layers 128 is increased among the expansion spaces G may have a thickness greater than that of other expansion spaces G_L formed by removing the other sacrificial layers 128 therebelow. Accordingly, the buffer insulating layer 150S may not completely fill the expansion space G_U formed in the preliminary contact pad regions 128RP while filling the other expansion spaces G_L.

Referring to FIG. 12C, an etching process may be performed into the first contact hole patterns Hc1 to leave a portion in which the buffer insulating layer 150S fills the other expansion spaces G_L and to remove the remainder, thereby forming the first insulating patterns 151 surrounding the first contact hole patterns Hc1. Thereafter, the via patterns 111 may be removed, and the expansion spaces formed in the first contact hole patterns Hc1 and the preliminary contact pad regions 128RP may be filled with a conductive material to form the first contact structures CS1 of FIGS. 6A to 7G.

Although FIGS. 12A to 12C illustrate a method of forming the gate contact plug CMC including the first contact structures CS1, the through contact plug THY including the second contact structures CS2 may also be formed in a manner similar thereto. However, the preliminary contact pad regions 128RP in which the thickness of the sacrificial layers 128 is increased are not formed in the region in which the second contact hole patterns Hc2 for formation of the second contact structures CS2 are disposed. Also, the buffer insulating layer 150S may be disposed to fill all expansion spaces horizontally extending from the second contact hole patterns Hc2. Accordingly, the second contact structures CS2 of FIGS. 8A and 8B may be formed.

Figure 13A:
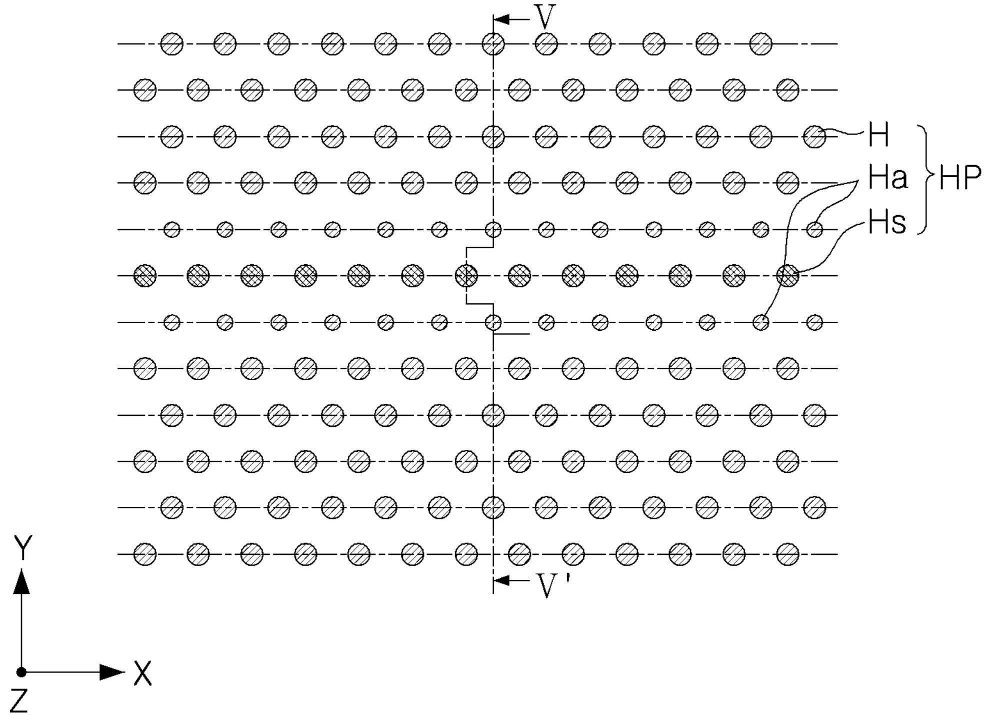
FIGS. 13A and 13B are schematic views illustrating a method of forming auxiliary patterns of a semiconductor device according to example embodiments.
Figure 13B:
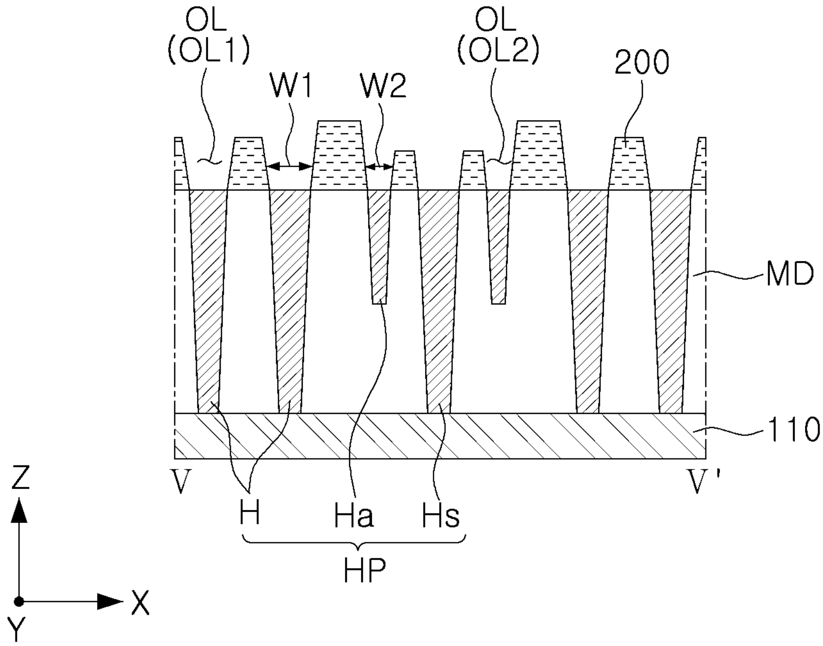

FIGS. 13A and 13B are schematic views illustrating a method of forming auxiliary patterns of a semiconductor device according to example embodiments. FIG. 13B illustrates a cross-section taken along line V-V' in FIG. 13A.

Referring to FIGS. 13A and 13B, the source structure 110 and the mold structure MD may be formed, the mask pattern 200 having openings OL may be formed on the mold structure MD, and the mask pattern 200 may be used as an etching mask to perform an etching process, thereby forming vertical hole patterns HP.

The vertical hole patterns HP may further include auxiliary hole patterns Ha between the separation hole patterns Hs and the hole patterns H. The openings OL may include a first opening OL1 having a first width W1 and a second opening OL2 having a second width W2 less than the first width W1. Auxiliary hole patterns Ha may be formed in the mold structure MD to correspond to the second opening OL2 having a relatively small width. The auxiliary hole patterns Ha may only partially penetrate through the mold structure MD from the upper portion. Due to the auxiliary hole patterns Ha, a process enhancement function that assists the photolithography process and the etching process to significantly reduce deformation of the shape of the separation hole patterns Hs and the hole patterns H may be performed.

Figure 14A:
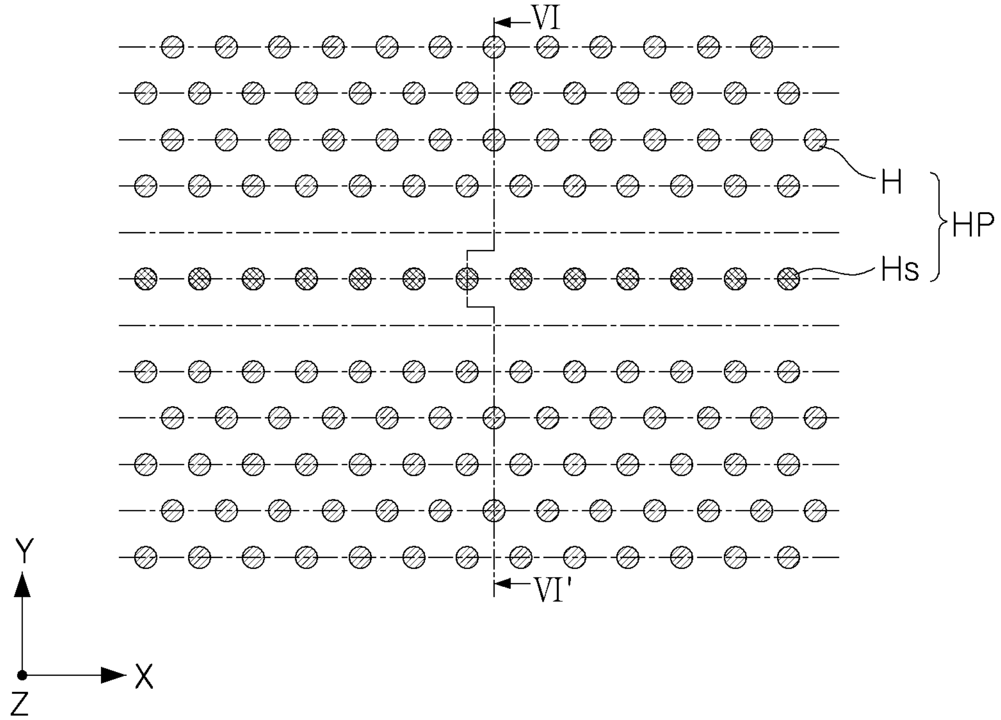
FIGS. 14A and 14B are schematic views illustrating a method of forming auxiliary patterns of a semiconductor device according to example embodiments.
Figure 14B:
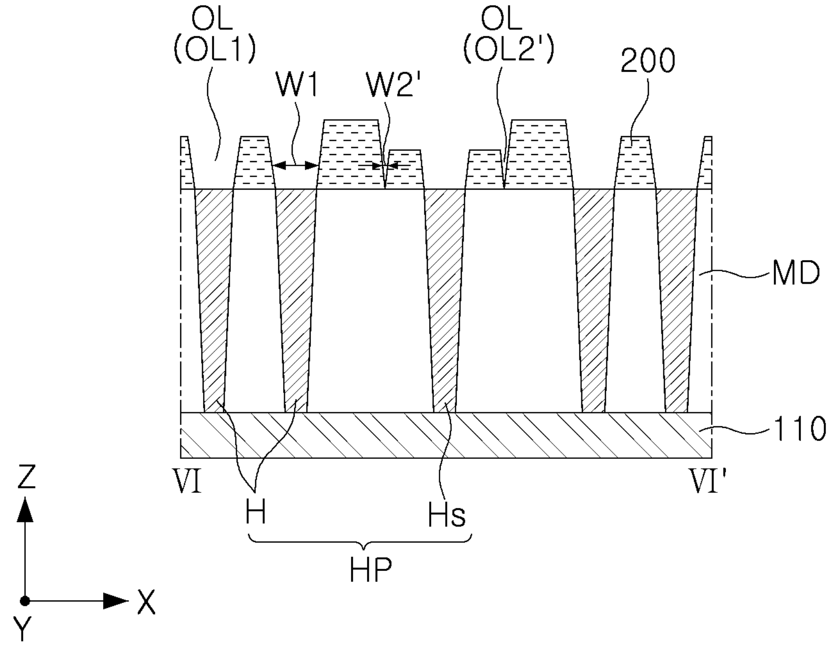

FIGS. 14A and 14B are schematic views illustrating a method of forming auxiliary patterns of a semiconductor device according to example embodiments. FIG. 14*b* illustrates a cross-section taken along line VI-VI' of FIG. 14A.

Referring to FIGS. 14A and 14B, the source structure 110 and the mold structure MD may be formed, the mask pattern 200 having the openings OL may be formed on the mold structure MD, and the mask pattern 200 may be used as an etch mask to perform an etching process, thereby forming the vertical hole patterns HP, but because a width W2' of a second opening OL2' is relatively smaller, patterning may not be performed on the mold structure MD in the region corresponding to the second opening OL2'. Even when the patterning process is not performed on the mold structure MD, the pattern continuity of the openings OL1 and OL2' may be maintained at the mask level, and therefore, the shape deformation of the separation hole patterns Hs and the hole patterns H may be significantly reduced.

Figure 15:
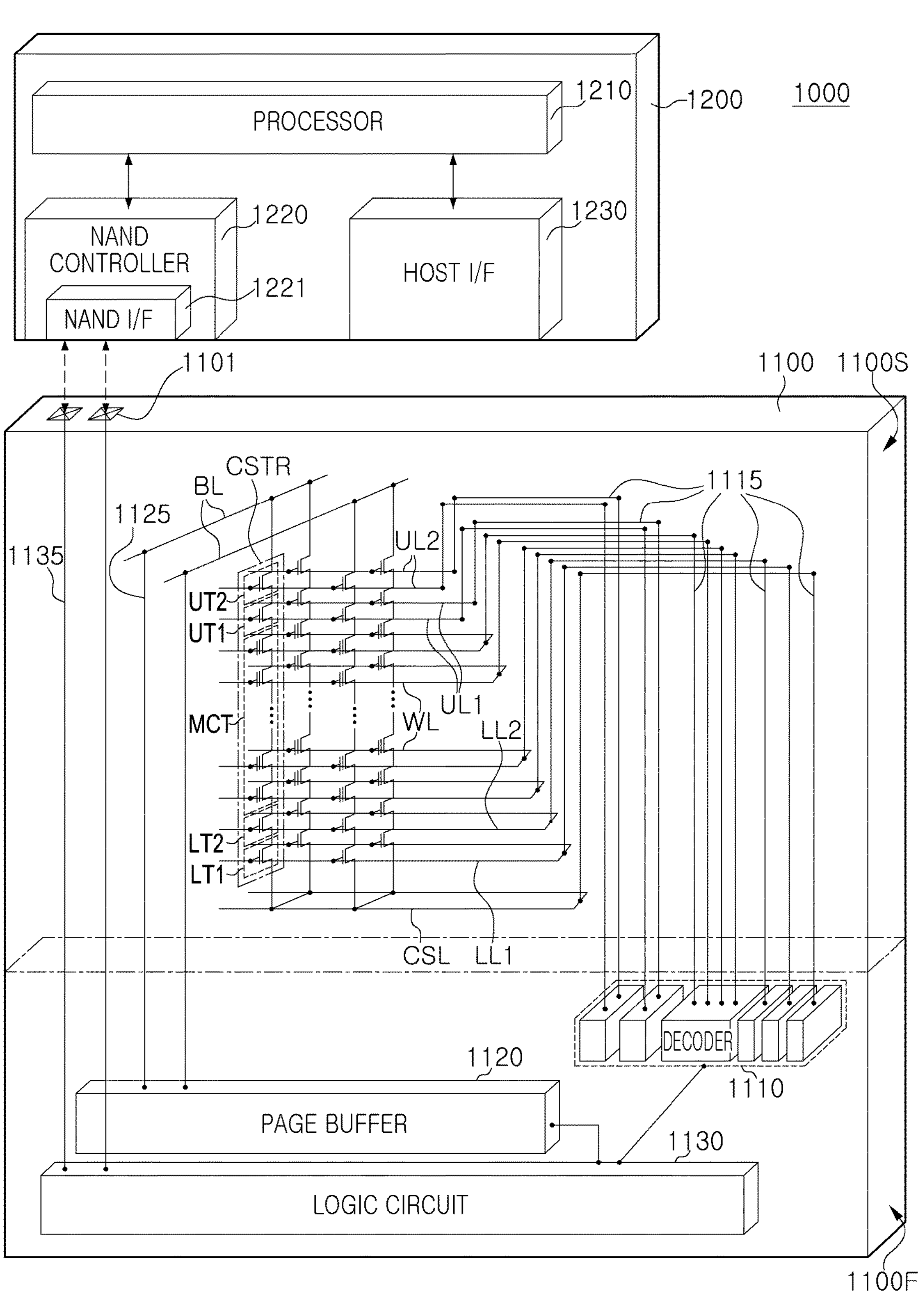
FIG. 15 is a diagram schematically illustrating a data storage system including a semiconductor device according to example embodiments.

FIG. 15 is a diagram schematically illustrating a data storage system including a semiconductor device according to example embodiments.

Referring to FIG. 15, a data storage system 1000 may include a semiconductor device 1100 and a controller 1200 electrically connected to the semiconductor device 1100. The data storage system 1000 may be a storage device including one or a plurality of semiconductor devices 1100 or an electronic device including a storage device. For example, the data storage system 1000 may be a solid state drive device (SSD), a universal serial bus (USB) device, a computing system, a medical device, or a communication device, including one or a plurality of semiconductor devices 1100.

The semiconductor device 1100 may be a nonvolatile memory device, for example, the NAND flash memory device described above with reference to FIGS. 1A to 8B. The semiconductor device 1100 may include a first structure 1100F and a second structure 1100S on the first structure 1100F. In example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously modified according to example embodiments.

In example embodiments, the upper transistors UT1 and UT2 may include a string select transistor, and the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used for an erase operation of erasing data stored in the memory cell transistors MCT using the GIDL phenomenon.

The common source line CSL, the first and second lower gate lines LL1 and LL2, the word lines WL, and the first and second upper gate lines UL1 and UL2 may be electrically connected to the decoder circuit 1110 through first connection interconnections 1115 extending from the inside of the first structure 1100F to the second structure 1100S. The bit lines BL may be electrically connected to the page buffer 1120 through second connection interconnections 1125 extending from the inside of the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection interconnection 1135 extending from the inside of the first structure 1100F to the second structure 1100S.

The controller 1200 may include a processor 1210, a NAND controller 1220, and a host interface 1230. In some example embodiments, the data storage system 1000 may include a plurality of semiconductor devices 1100, and in this case, the controller 1200 may control the plurality of semiconductor devices 1100.

The processor 1210 may control the overall operation of the data storage system 1000 including the controller 1200. The processor 1210 may operate according to a predetermined firmware, and may access the semiconductor device 1100 by controlling the NAND controller 1220. The NAND controller 1220 may include a controller interface 1221 that processes communication with the semiconductor device 1100. Through the controller interface 1221, a control command for controlling the semiconductor device 1100, data to be written to the memory cell transistors MCT of the semiconductor device 1100, data to be read from the memory cell transistors MCT, and the like may be transmitted. The host interface 1230 may provide a communication function between the data storage system 1000 and an external host. When receiving a control command from an external host through the host interface 1230, the processor 1210 may control the semiconductor device 1100 in response to the control command.

Figure 16:
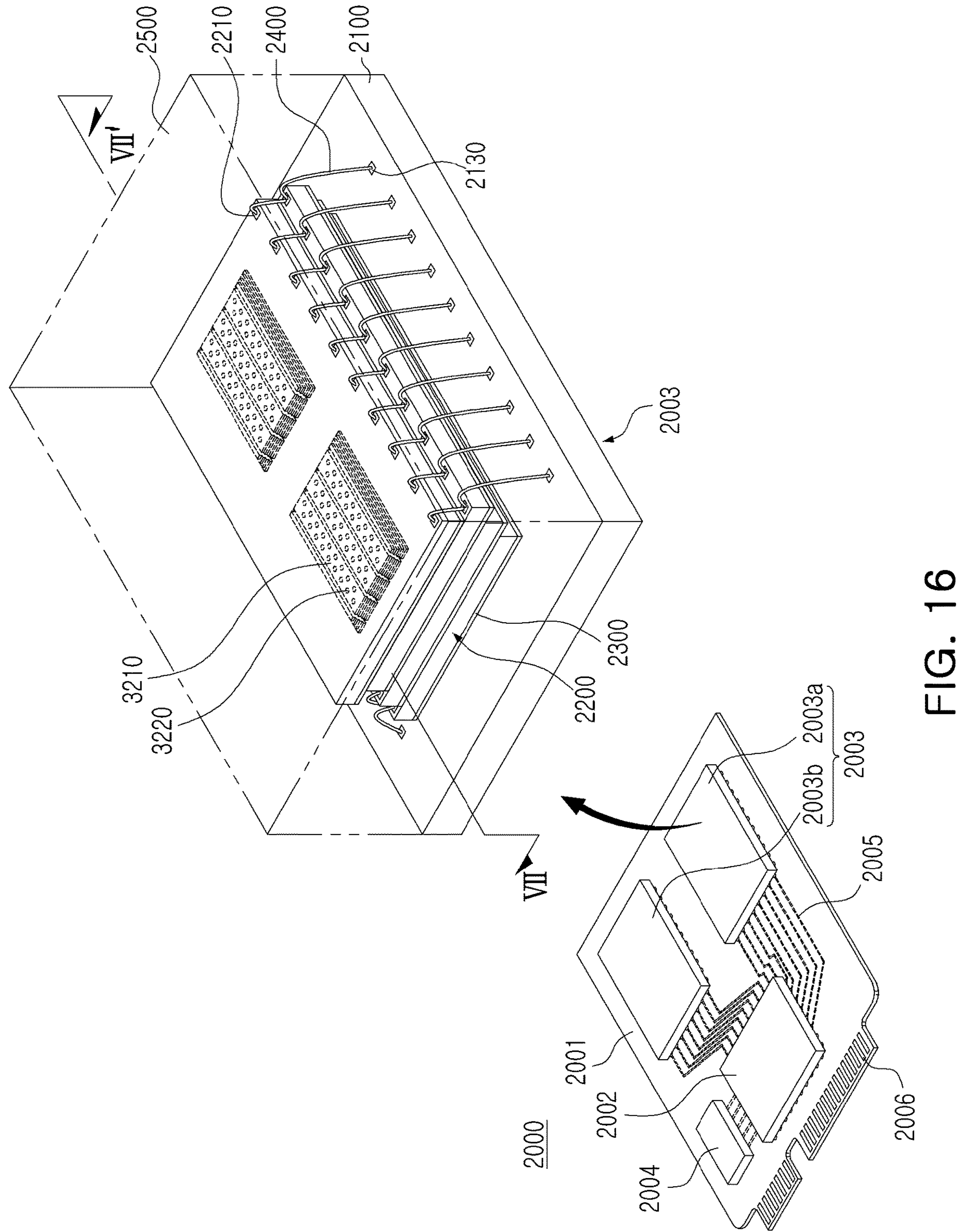
FIG. 16 is a schematic perspective view of a data storage system including a semiconductor device according to an example embodiment.

FIG. 16 is a schematic perspective view of a data storage system including a semiconductor device according to an example embodiment.

Referring to FIG. 16, a data storage system 2000 according to an example embodiment may include a main board 2001, a controller 2002 mounted on the main board 2001, one or more semiconductor packages 2003, and a DRAM 2004. The semiconductor package 2003 and the DRAM 2004 may be connected to the controller 2002 by interconnection patterns 2005 formed on the main board 2001.

The main board 2001 may include a connector 2006 including a plurality of pins coupled to an external host. The number and arrangement of the plurality of pins in the connector 2006 may vary according to a communication interface between the data storage system 2000 and the external host. In example embodiments, the data storage system 2000 may communicate with an external host according to any one of the interfaces such as a Universal Serial Bus (USB), Peripheral Component Interconnect Express (PCI-Express), Serial Advanced Technology Attachment (SATA), an M-Phy for Universal Flash Storage (UFS), and the like. In example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data to or read data from the semiconductor package 2003, and may improve the operating speed of the data storage system 2000.

The DRAM 2004 may be a buffer memory for reducing a speed difference between the semiconductor package 2003 as a data storage space and an external host. The DRAM 2004 included in the data storage system 2000 may also operate as a kind of cache memory, and may provide a space for temporarily storing data in a control operation for the semiconductor package 2003. For example, when the data storage system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the semiconductor chips 2200 on the package substrate 2100, adhesive layers 2300 disposed on lower surfaces of the semiconductor chips 2200, respectively, a connection structure 2400 electrically connecting the semiconductor chips 2200 and the package substrate 2100, and a molding layer 2500 covering the semiconductor chips 2200 and the connection structure 2400 on the package substrate 2100.

The package substrate 2100 may be a printed circuit board including upper package pads 2130. Each semiconductor chip 2200 may include an input/output pad 2210. The input/output pad 2210 may correspond to the input/output pad 1101 of FIG. 15. Each of the semiconductor chips 2200 may include gate stack structures 3210 and channel structures 3220. Each of the semiconductor chips 2200 may include the semiconductor device described above with reference to FIGS. 1A to 8B.

In example embodiments, the connection structure 2400 may be a bonding wire electrically connecting the input/output pad 2210 and the upper package pads 2130. Accordingly, in each of the first and second semiconductor packages 2003*a* and 2003*b*, the semiconductor chips 2200 may be electrically connected to each other by a bonding wire method, and may be electrically connected to the upper package pads 2130 of the package substrate 2100. According to example embodiments, in each of the first and second semiconductor packages 2003*a* and 2003*b*, the semiconductor chips 2200 may also be electrically connected to each other by a connection structure including a Through Silicon Via (TSV) instead of the connection structure 2400 of the bonding wire method.

In example embodiments, the controller 2002 and the semiconductor chips 2200 may be included in one package. In an example embodiment, the controller 2002 and the semiconductor chips 2200 may be mounted on a separate interposer substrate different from the main board 2001, and the controller 2002 and the semiconductor chips 2200 may be connected to each other by interconnections formed on the interposer substrate.

Figure 17:
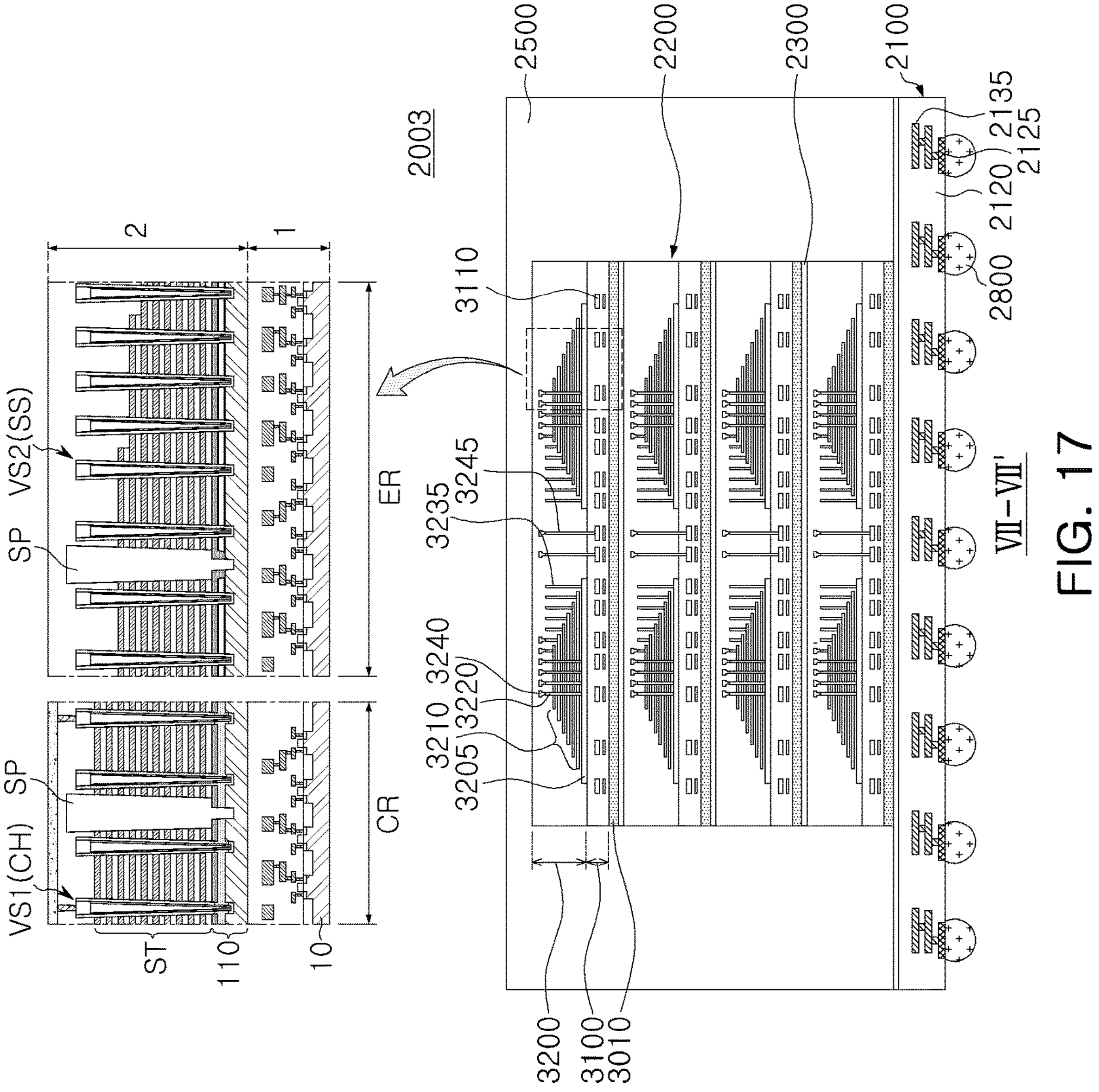
FIG. 17 is a cross-sectional view schematically illustrating a semiconductor package according to an example embodiment.

FIG. 17 is a cross-sectional view schematically illustrating a semiconductor package according to an example embodiment. FIG. 17 illustrates an example embodiment of the semiconductor package 2003 of FIG. 16, and conceptually illustrates a region taken along line VII-VII' of the semiconductor package 2003 of FIG. 16.

Referring to FIG. 17, in the semiconductor package 2003, the package substrate 2100 may be a printed circuit board. The package substrate 2100 may include a package substrate body 2120, upper package pads 2130 (see FIG. 17) disposed on an upper surface of the package substrate body 2120, lower pads 2125 disposed on or exposed through the lower surface of the package substrate body 2120, and internal interconnections 2135 electrically connecting the upper package pads 2130 and the lower pads 2125 inside the package substrate body 2120. The upper package pads 2130 may be electrically connected to the connection structures 2400. The lower pads 2125 may be connected to the interconnection patterns 2005 of the main board 2001 of the data storage system 2000 as illustrated in FIG. 17 through conductive connection portions 2800.

Each of the semiconductor chips 2200 may include a semiconductor substrate 3010, and a first structure 3100 and a second structure 3200 that are sequentially stacked on the semiconductor substrate 3010. The first structure 3100 may include a peripheral circuit region including peripheral interconnections 3110. The second structure 3200 may include a common source line 3205, a gate stack structure 3210 on the common source line 3205, channel structures 3220 and separation regions 3230 passing through the gate stack structure 3210, bit lines 3240 electrically connected to the channel structures 3220, and gate contact plugs 3235 electrically connected to the word lines WL of the gate stack structure 3210 (see FIG. 15). As described above with reference to FIGS. 1A to 8G, each of the semiconductor chips 2200 may include a substrate 10, a source structure 110, a stack structure ST including gate electrodes 130, first vertical structures VS1, and second vertical structures VS2.

Each of the semiconductor chips 2200 may include a through interconnection 3245 electrically connected to the peripheral interconnections 3110 of the first structure 3100 and extending into the second structure 3200. The through interconnection 3245 may be disposed outside the gate stack structure 3210, and may be further disposed to pass through the gate stack structure 3210. Each of the semiconductor chips 2200 may further include an input/output pad 2210 (refer to FIG. 16) electrically connected to the peripheral interconnections 3110 of the first structure 3100.

Figure 18:
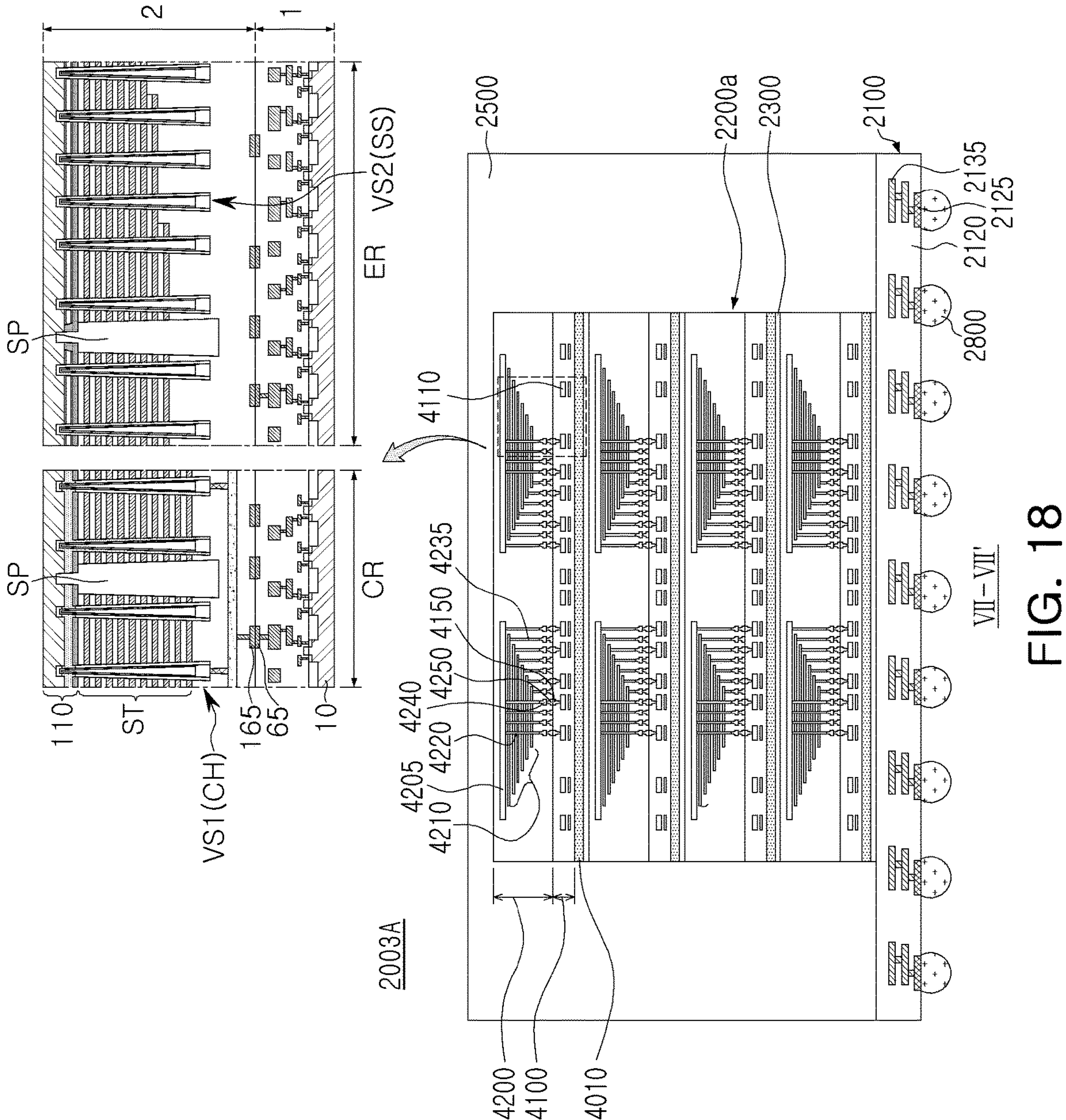
FIG. 18 is a cross-sectional view schematically illustrating a semiconductor package according to an example embodiment.

FIG. 18 is a cross-sectional view schematically illustrating a semiconductor package according to example embodiments. FIG. 18 illustrates a semiconductor package 2003A in the region corresponding to FIG. 17.

Referring to FIG. 18, a semiconductor package 2003A may include a first structure 4100 on a semiconductor substrate 4010, and a second structure 4200 located at the first structure 4100 to be bonded to the first structure 4100 by a wafer bonding method.

The first structure 4100 may include a peripheral circuit region including a peripheral interconnection 4110 and first bonding structures 4150. The second structure 4200 may include a common source line 4205, a gate stack structure 4210 between the common source line 4205 and the first structure 4100, memory channel structures 4220 and a separation structure 4230 passing through the gate stack structure 4210, and second bonding structures 4250 electrically connected to the memory channel structures 4220 and the word lines (WL of FIG. 15) of the gate stack structure 4210, respectively. For example, the second bonding structures 4250 may be electrically connected to the memory channel structures 4220 and the word lines (WL of FIG. 15) respectively, through bit lines 4240 electrically connected to the memory channel structures 4220 and the gate connection wirings 4235 electrically connected to the word lines (WL in FIG. 15). The first bonding structures 4150 of the first structure 4100 and the second bonding structures 4250 of the second structure 4200 may be bonded while being in contact with each other. Bonded portions of the first bonding structures 4150 and the second bonding structures 4250 may be formed of, for example, copper (Cu).

As illustrated in the enlarged view, each of semiconductor chips 2200*a* may further include a substrate 10, a source structure 110, a stack structure ST including gate electrodes 130, first vertical structures VS1 and second vertical structures VS2. In each of semiconductor chips 2200*b*, the second structure 2 may be vertically inverted on the first structure 1 as compared with the semiconductor chips 2200 of FIG. 17, and the first structure 1 and the second structure 2 may be directly bonded without intervening an adhesive such as a separate adhesive layer. For example, the first bonding pads 65 of the first structure 1 may be bonded to the second bonding pads 165 of the second structure 2. Each of the semiconductor chips 2200*b* may further include an input/output pad (2210 of FIG. 16) electrically connected to the peripheral interconnections 4110 of the first structure 4100.

As set forth above, according to an example embodiment, as the design of vertical structures in which the gate electrodes are disposed in the step area having a step structure is the same as or similar to the design of vertical structures disposed in the memory cell array region, a semiconductor device having improved reliability and productivity and a data storage system including the same may be provided.

While aspects of example embodiments have been particularly shown and described, it will be understood that various changes in form and details may be made therein without departing from the spirit and scope of the following claims.

What is claimed is:

1. A semiconductor device comprising:
- a first structure comprising a substrate, circuit elements on the substrate, and lower interconnections on the circuit elements; and
- a second structure on the first structure,
- wherein the second structure comprises:
  - a source structure having a first region and a second region;
  - gate electrodes provided on the source structure and spaced apart from each other, extending in a first direction parallel to an upper surface of the substrate, and comprising pad regions forming a step structure on the second region;
  - separation patterns passing through the gate electrodes and extending in the first direction;
  - first vertical structures provided between the separation patterns on the first region and extending through the gate electrodes; and
  - second vertical structures provided between the separation patterns, on the second region and extending through the pad regions of the gate electrodes,
- wherein the second vertical structures and the first vertical structures have a common lattice arrangement,
- wherein the first vertical structures comprise a channel structure having a first diameter, and a first auxiliary pattern having a second diameter less than the first diameter of the channel structure,
- wherein the first auxiliary pattern is provided between the separation patterns and the channel structure, and
- wherein a lower end of the first auxiliary pattern is located at a higher level than a lower end of the channel structure.

2. The semiconductor device of claim 1, wherein the first vertical structures are arranged at a first pitch along the first direction,
- wherein the second vertical structures are arranged at a second pitch along the first direction, and
- wherein the second pitch is about 0.5 times to about 1.5 times the first pitch.

3. The semiconductor device of claim 1, wherein the channel structure comprises a dielectric layer in contact with the gate electrodes and extending to the lower end of the channel structure, and a channel layer on the dielectric layer,
- wherein the first auxiliary pattern comprises an auxiliary dielectric layer in contact with the gate electrodes and extending to the lower end of the first auxiliary pattern, and an auxiliary channel layer on the auxiliary dielectric layer, and wherein a distance between a lower end of the auxiliary channel layer and the lower end of the first auxiliary pattern is greater than a distance between a lower end of the channel layer and the lower end of the channel structure.

4. The semiconductor device of claim 1, wherein the second vertical structures comprise a support structure having a third diameter and a second auxiliary pattern having a fourth diameter less than the third diameter of the support structure, wherein the second auxiliary pattern is provided between the separation patterns and the support structure, and wherein a lower end of the second auxiliary pattern is located at a higher level than a lower end of the support structure.

5. The semiconductor device of claim 4, wherein the support structure comprises a support dielectric layer in contact with the gate electrodes and extending to the lower end of the support structure, and a support channel layer on the support dielectric layer, wherein the second auxiliary pattern comprises an auxiliary dielectric layer in contact with the gate electrodes and extending to the lower end of the second auxiliary pattern, and an auxiliary channel layer on the auxiliary dielectric layer, and wherein a distance between a lower end of the auxiliary channel layer and the lower end of the second auxiliary pattern is greater than a distance between a lower end of the support channel layer and the lower end of the support structure.

6. The semiconductor device of claim 1, wherein the second vertical structures comprise support structures and contact structures provided between the support structures, and wherein the contact structures are electrically connected to each other in one group and are commonly connected to a first gate electrode among the gate electrodes to provide one gate contact plug.

7. The semiconductor device of claim 6, wherein the contact structures extend from the second structure to the first structure and are connected to a first lower interconnection among the lower interconnections, and wherein the contact structures are electrically insulated from second gate electrodes provided lower than the first gate electrode among the gate electrodes.

8. The semiconductor device of claim 6, wherein the one gate contact plug comprises a contact extension that extends between the contact structures constituting the one group, wherein the first gate electrode comprises a contact pad region having an increased thickness, and wherein the contact extension is directly connected to the contact pad region of the first gate electrode.

9. The semiconductor device of claim 8, wherein the contact extension has a wavy side surface in plan view.

10. The semiconductor device of claim 6, wherein the second vertical structures further comprise second auxiliary patterns provided between the support structures and the contact structures, wherein the second auxiliary patterns have a diameter less than a diameter of the support structures, and wherein lower ends of the second auxiliary patterns are positioned at a higher level than lower ends of the support structures.

11. The semiconductor device of claim 1, wherein the second vertical structures comprise support structures and contact structures between the support structures, wherein the contact structures pass through the source structure and extend below a lower surface of the source structure, wherein the contact structures form a group and are connected together with a first lower interconnection among the lower interconnections to provide a single through contact plug, and wherein the contact structures are electrically insulated from the gate electrodes.

12. The semiconductor device of claim 11, wherein the second vertical structures further comprise second auxiliary patterns provided between the support structures and the contact structures, wherein the second auxiliary patterns have a diameter less than a diameter of the support structures, and wherein lower ends of the second auxiliary patterns are positioned at a higher level than lower ends of the support structures.

13. The semiconductor device of claim 1, wherein upper regions of side surfaces of the separation patterns have a double embossed shape comprising embossing patterns having different curvatures, and lower regions of the side surfaces of the separation patterns have a single embossed shape comprising an embossing pattern having a single curvature.

14. A semiconductor device comprising:

a source structure having a first region and a second region;

gate electrodes stacked on the source structure and spaced apart from each other, extending in a first direction, and comprising pad regions forming a step structure on the second region;

separation patterns passing through the gate electrodes and extending from the first region onto the second region in the first direction;

channel structures provided between the separation patterns, and extending through the gate electrodes on the first region;

support structures provided between the separation patterns, and extending through the pad regions of the gate electrodes on the second region; and a contact plug provided between the support structures on the second region, and comprising a cluster of contact structures electrically connected to each other, wherein the cluster of contact structures has a continuous arrangement with the support structures.

15. The semiconductor device of claim 14, wherein the support structures and the channel structures have a common lattice arrangement.

16. The semiconductor device of claim 14, further comprising auxiliary patterns passing through a portion of the gate electrodes, wherein one of the separation patterns is provided between two of the auxiliary patterns, wherein a diameter of the auxiliary patterns is less than a diameter of the channel structures, and wherein lower ends of the auxiliary patterns are located at a higher level than lower ends of the channel structures.

17. The semiconductor device of claim 14, wherein the contact plug is a gate contact plug in contact with one of the gate electrodes and electrically insulated from other gate electrodes, or a through plug electrically insulated from each of the gate electrodes.

18. The semiconductor device of claim 14, wherein the support structures pass through a smaller number of the gate electrodes than the channel structures.

19. A data storage system comprising:

a semiconductor storage device comprising:

a substrate;

circuit elements on the substrate;

a source structure provided on the substrate and having a first region and a second region;

gate electrodes stacked on the source structure and spaced apart from each other, extending in a first direction and comprising pad regions forming a step structure, on the second region;

separation patterns passing through the gate electrodes, extending in the first direction from the first region onto the second region;

channel structures provided between the separation patterns and extending through the gate electrodes on the first region;

support structures provided between the separation patterns and extending through the pad regions of the gate electrodes on the second region; and an input/output pad electrically connected to the circuit elements; and a controller electrically connected to the semiconductor storage device through the input/output pad and configured to control the semiconductor storage device, wherein the support structures and the channel structures have a common lattice arrangement, and wherein upper regions of side surfaces of the separation patterns have a double embossed shape comprising embossing patterns having different curvatures, and lower regions of the side surfaces of the separation patterns have a single embossed shape comprising an embossing pattern having a single curvature.

* * * * *